United States Patent
Li et al.

(10) Patent No.: US 12,009,383 B2
(45) Date of Patent: Jun. 11, 2024

(54) LIGHT EMITTING DEVICE AND DISPLAY DEVICE COMPRISING PARTITION WALLS BETWEEN EMISSION AREAS

(71) Applicant: SAMSUNG DISPLAY CO., LTD., Yongin-si (KR)

(72) Inventors: Xinxing Li, Yongin-si (KR); Hyun Min Cho, Yongin-si (KR); Dae Hyun Kim, Yongin-si (KR); Veidhes Basrur, Yongin-si (KR); Bek Hyun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 537 days.

(21) Appl. No.: 17/277,284

(22) PCT Filed: Mar. 19, 2019

(86) PCT No.: PCT/KR2019/003188
§ 371 (c)(1),
(2) Date: Mar. 17, 2021

(87) PCT Pub. No.: WO2020/059987
PCT Pub. Date: Mar. 26, 2020

(65) Prior Publication Data
US 2022/0028923 A1 Jan. 27, 2022

(30) Foreign Application Priority Data

Sep. 19, 2018 (KR) .......................... 10-2018-0112459

(51) Int. Cl.
*H01L 33/24* (2010.01)
*H01L 27/15* (2006.01)
(Continued)

(52) U.S. Cl.
CPC ............ *H01L 27/156* (2013.01); *H01L 33/24* (2013.01); *H01L 33/38* (2013.01); *H01L 33/44* (2013.01)

(58) Field of Classification Search
CPC ..... H01L 25/167; H01L 27/124; H01L 33/44; H01L 27/156; H01L 33/62
(Continued)

(56) References Cited

U.S. PATENT DOCUMENTS 7,741,760 B2  6/2010  Moriyama et al.
8,216,440 B2  7/2012  Shibata et al.
(Continued)

FOREIGN PATENT DOCUMENTS

CN   103219355 A   7/2013
JP   07-044029 Y2  10/1995
(Continued)

OTHER PUBLICATIONS

International Search Report for PCT /KR2019/003188, dated Jun. 18, 2019, 4 pages.
(Continued)

*Primary Examiner* — Didarul A Mazumder
(74) *Attorney, Agent, or Firm* — Lewis Roca Rothgerber Christie LLP

(57) ABSTRACT

A light emitting device may include: a first emission area including a first light emitting diode: a second emission area including a second light emitting diode, at least one pair of first and second partition walls facing each other in each of the first and second emission areas at least one first electrode on the first partition wall to cover the first partition wall, and being electrically connected to a first end of at least one of the first and second light emitting diodes; and at least one second electrode on the second partition wall to cover the second partition wall, and being electrically connected to a (Continued)

second end of at least one of the first and second light emitting diodes. The first and second partition walls may have, in the first emission area, a structure different from that in the second emission area.

20 Claims, 26 Drawing Sheets

(51) Int. Cl.
*H01L 33/38* (2010.01)
*H01L 33/44* (2010.01)
(58) Field of Classification Search
USPC .......................... 257/88; 438/22, 24, 46, 47
See application file for complete search history.

(56) References Cited

U.S. PATENT DOCUMENTS

| | | | |
|---|---|---|---|
| 8,872,214 | B2 | 10/2014 | Negishi et al. |
| 9,111,890 | B2 | 8/2015 | Chung et al. |
| 9,287,242 | B2 | 3/2016 | Shibata et al. |
| 9,570,425 | B2 | 2/2017 | Do |
| 10,446,724 | B2 | 10/2019 | Kwon et al. |
| 10,461,123 | B2 | 10/2019 | Kim et al. |
| 10,573,667 | B2 | 2/2020 | Ikeda et al. |
| 10,672,946 | B2 | 6/2020 | Cho et al. |
| 10,790,330 | B2 | 9/2020 | Lee et al. |
| 10,937,361 | B2 | 3/2021 | Hughes et al. |
| 2006/0125716 | A1* | 6/2006 | Wong ........................ G09F 9/33 345/44 |
| 2011/0089850 | A1 | 4/2011 | Shibata et al. |
| 2013/0027623 | A1 | 1/2013 | Negishi et al. |
| 2016/0148911 | A1 | 5/2016 | Do |
| 2017/0317228 | A1 | 11/2017 | Sung |
| 2017/0358563 | A1 | 12/2017 | Cho et al. |
| 2018/0012876 | A1* | 1/2018 | Kim ........................ H01L 33/387 |
| 2018/0019369 | A1* | 1/2018 | Cho ........................ H05K 1/181 |
| 2018/0287010 | A1 | 10/2018 | Sung |
| 2019/0019930 | A1 | 1/2019 | Do et al. |
| 2019/0319168 | A1 | 10/2019 | Kim |

FOREIGN PATENT DOCUMENTS

| | | | |
|---|---|---|---|
| JP | 10-107325 | A | 4/1998 |
| JP | 2004-354476 | A | 12/2004 |
| JP | 2006-302874 | A | 11/2006 |
| JP | 2008-260073 | A | 10/2008 |
| JP | 2011-103199 | A | 5/2011 |
| JP | 4914929 | B2 | 5/2011 |
| JP | 2011-211047 | A | 10/2011 |
| JP | 4814394 | B2 | 10/2011 |
| JP | 2017-534917 | A | 11/2017 |
| KR | 10-2003-0024076 | | 3/2003 |
| KR | 20030024076 | A * | 3/2003 |
| KR | 10-1436123 | B1 | 11/2014 |
| KR | 10-1490758 | B1 | 1/2015 |
| KR | 10-1672781 | B1 | 5/2016 |
| KR | 10-1713818 | B1 | 5/2016 |
| KR | 10-1628345 | B1 | 6/2016 |
| KR | 10-2017-0026959 | | 3/2017 |
| KR | 10-1711187 | B1 | 3/2017 |
| KR | 10-2018-0007376 | | 1/2018 |
| KR | 10-2018-0060816 | A | 6/2018 |
| KR | 10-2018-0072909 | A | 7/2018 |
| KR | 10-2018-0093001 | | 8/2018 |
| KR | 10-2019-0120467 | A | 10/2019 |
| KR | 10-2020-0006209 | A | 1/2020 |
| WO | 2011/136623 | A2 | 11/2011 |
| WO | 2017/156700 | A1 | 9/2017 |

OTHER PUBLICATIONS

Extended European Search Report issued on May 23, 2022, in corresponding European Patent Application No. 19861822.5 (8 pages).

* cited by examiner

FIG. 6
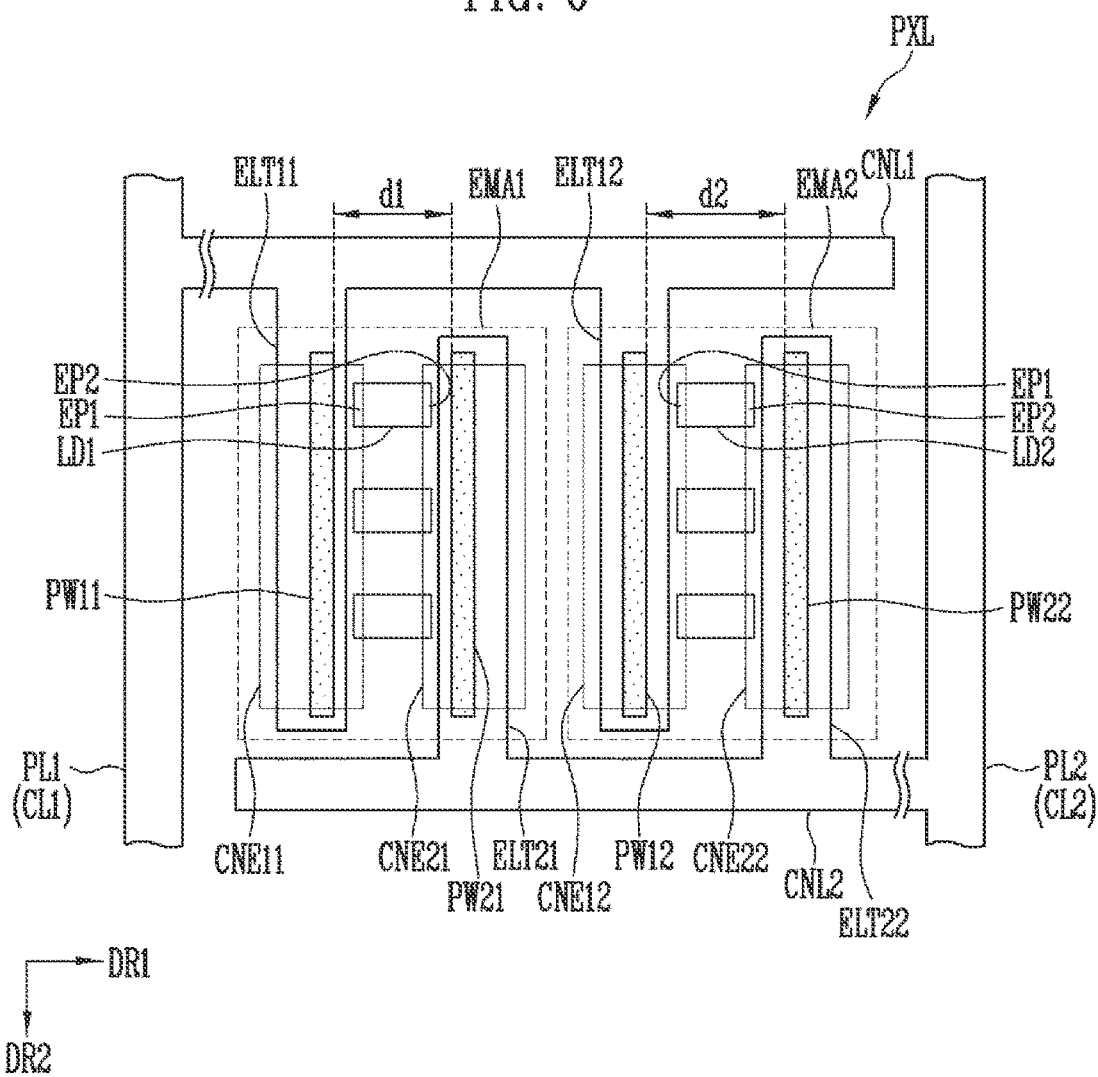
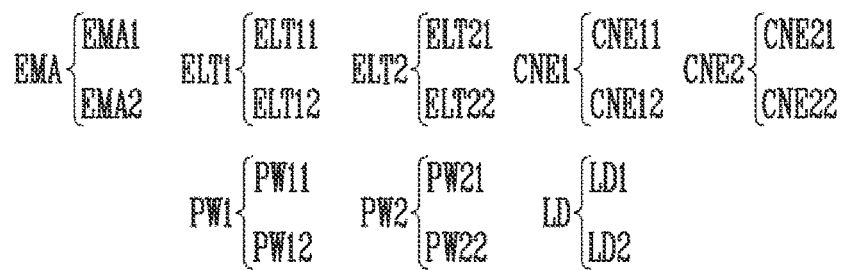

FIG. 9
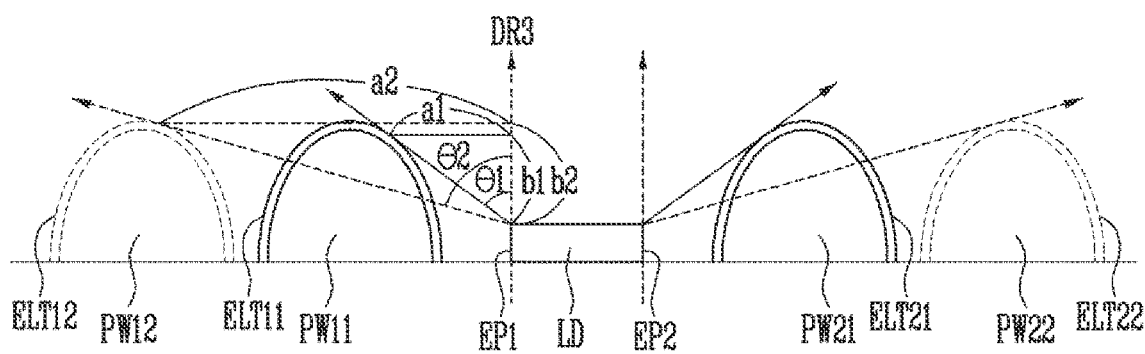
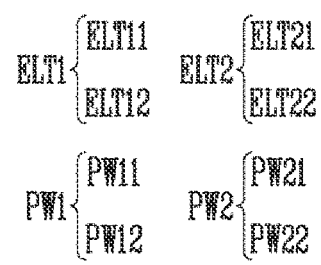

LIGHT EMITTING DEVICE AND DISPLAY DEVICE COMPRISING PARTITION WALLS BETWEEN EMISSION AREAS

CROSS-REFERENCE TO RELATED APPLICATION(S)

This application is a U.S. National Phase Patent Application of International Patent Application Number PCT/KR2019/003188, filed on Mar. 19, 2019, which claims priority of Korean Patent Application No. 10-2018-0112459, filed on Sep. 19, 2018, the entire content of all of which is incorporated herein by reference.

TECHNICAL FIELD

Embodiments of the present disclosure relate to a light emitting device and a display device including the light emitting device.

BACKGROUND ART

Recently, a technique of manufacturing a subminiature light emitting diode using a material having a reliable inorganic crystal structure and manufacturing a light emitting device using the subminiature light emitting diode has been developed. For example, a technique of manufacturing subminiature light emitting diodes having a small size corresponding to a range from a nano-scale size to a micro-scale size and forming a light source of a light emitting device using the subminiature light emitting diodes has been developed. Such light emitting devices may be provided in various electronic devices such as a display device and a lighting device.

DISCLOSURE

Technical Problem

Embodiments of the present disclosure provide a light emitting device including a light emitting diode, and a display device including the light emitting device.

Technical Solution

An embodiment of the present disclosure may provide a light emitting device including a first emission area including a first light emitting diode; a second emission area including a second light emitting diode; at least one pair of first and second partition walls disposed to face each other in each of the first emission area and the second emission area, at least one first electrode disposed on the first partition wall to cover the first partition wall, the at least one first electrode being electrically connected to a first end of at least one of the first and second light emitting diodes, and at least one second electrode disposed on the second partition wall to cover the second partition wall, the at least one second electrode being electrically connected to a second end of at least one of the first and second light emitting diodes. The at least one pair of first and second partition walls may have, in the first emission area, a structure different from a structure thereof in the second emission area.

In an embodiment, the at least one pair of first and second partition walls may be disposed in the first emission area at positions spaced apart from each other by a first distance. The at least one pair of first and second partition walls may be disposed in the second emission area at positions spaced apart from each other by a second distance greater than the first distance.

In an embodiment, the at least one pair of first and second partition walls may be spaced apart from each other in a first direction in each of the first emission area and the second emission area. Each of the first partition wall and the second partition wall may extend in a second direction intersecting with the first direction.

In an embodiment, the first emission area and the second emission area may be successively disposed (arranged) in the first direction.

In an embodiment, the first emission area and the second emission area may be successively disposed (arranged) in the second direction.

In an embodiment, each of the first partition wall and the second partition wall may integrally extend in the first emission area and the second emission area. At least one partition wall of the first partition wall and the second partition wall may have a bent part on a boundary between the first emission area and the second emission area.

In an embodiment, the at least one partition wall may have a structure that is bent in a curved shape on the boundary between the first emission area and the second emission area.

In an embodiment, the first partition wall and the second partition wall of the at least one pair of first and second partition walls may have a symmetrical structure in each of the first emission area and the second emission area.

In an embodiment, the first partition wall and the second partition wall of the at least one pair of first and second partition walls may have an asymmetrical structure in at least one emission area of the first emission area and the second emission area.

In an embodiment, at least one partition wall of the first partition wall and the second partition wall may have a first height in the first emission area and a second height less than the first height in the second emission area.

In an embodiment, in the first emission area, each of the first partition wall and the second partition wall may have a pattern continuously extending in a predetermined (set) direction. Each of the first partition wall and the second partition wall may have a discontinuous pattern in the second emission area.

In an embodiment, the at least one pair of first and second partition walls may be disposed to face the first end and the second end of the first light emitting diode in the first emission area. The at least one pair of first and second partition walls may expose the first end and the second end of the second light emitting diode in the second emission area.

In an embodiment, the at least one pair of first and second partition walls may include an 11-th partition wall disposed in the first emission area, a 21-st partition wall disposed in the first emission area to make a pair with the 11-th partition wall; a 12-th partition wall disposed in the second emission area; and a 22-nd partition wall disposed in the second emission area to make a pair with the 12-th partition wall.

In an embodiment, the at least one first electrode may include, an 11-th electrode disposed on the 11-th partition wall, and a 12-th electrode disposed on the 12-th partition wall and connected to the 11-th electrode.

In an embodiment, the at least one first electrode may include: an 11-th electrode disposed on the 11-th partition wall; and a 12-th electrode disposed on the 12-th partition wall and separated from the 11-th electrode.

In an embodiment, the at least one pair of first and second partition walls may include: an 11-th partition wall disposed in the first emission area; a 12-th partition wall disposed in the second emission area; and a second common partition wall disposed in an intersection area between the first emission area and the second emission area, and formed to make a pair with each of the 11-th partition wall and the 12-th partition wall.

In an embodiment, each of the at least one first electrode and the at least one second electrode may include at least one reflective electrode layer. The first end of the at least one of the first and second light emitting diodes may be disposed to face any one first electrode, and the second end of the at least one of the first and second light emitting diodes may be disposed to face any one second electrode.

An embodiment of the present disclosure may provide a display device including a display area and a pixel disposed in the display area. The pixel may include: a first emission area including a first light emitting diode; a second emission area including a second light emitting diode; at least one pair of first and second partition walls disposed to face each other in each of the first emission area of the second emission area at least one first electrode disposed on the first partition wall to cover the first partition wall, the at least one first electrode being electrically connected to a first end of at least one of the first and second light emitting diodes; and at least one second electrode disposed on the second partition wall to cover the second partition wall, the at least one second electrode being electrically connected to a second end of at least one of the first and second light emitting diodes. The at least one pair of first and second partition walls may have, in the first emission area, a structure different from a structure thereof in the second emission area.

In an embodiment, a height of the at least one pair of first and second partition walls or a distance therebetween in the first emission area may differ from a height thereof or a distance therebetween in the second emission area.

In an embodiment, in the first emission area, the at least one pair of first and second partition walls may have patterns continuously extending in a predetermined (set) direction, and be disposed to face the first end and the second end of the first light emitting diode. In the second emission area, the at least one pair of first and second partition walls may have discontinuous patterns and may expose the first and second ends of the second light emitting diode.

Advantageous Effects

In a light emitting device and a display device including the light emitting device in accordance with various embodiments of the present disclosure, an emission area of each light emitting device or pixel is divided into a plurality of emission areas, and a partition wall has a different structure in each emission area. Thereby, light emitted from light emitting diodes provided in each light emitting device or pixel may be dispersed and emitted within a comparatively wide view angle range.

DESCRIPTION OF DRAWINGS

FIGS. 2A and 3B are respectively a perspective view and a sectional view illustrating a light emitting diode in accordance with an embodiment of the present disclosure.

FIGS. 6 and 7 each are a plan view illustrating different examples of a pixel including a light emitting device in accordance with one or more embodiments of the present disclosure.

FIG. 9 is a sectional view illustrating a change in view angle depending on a distance between a light emitting diode and first and second partition walls in accordance with an embodiment of the present disclosure.

DETAILED DESCRIPTION OF THE DISCLOSURE

Figure 1A:
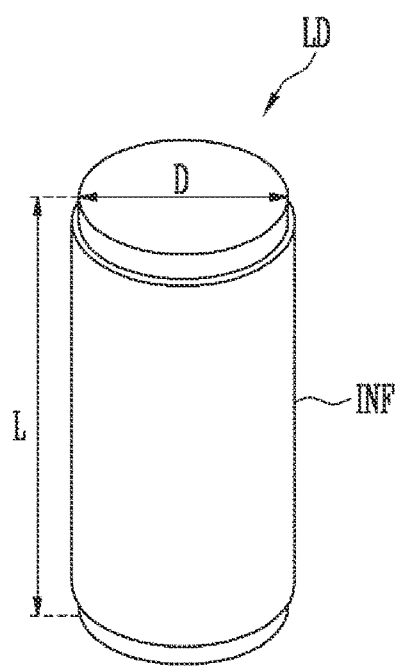
FIGS. 1A and 1B are respectively a perspective view and a sectional view illustrating a light emitting diode in accordance with an embodiment of the present disclosure.

Reference will now be made in more detail to various embodiments of the present disclosure, specific examples of which are illustrated in the accompanying drawings and described below, since the embodiments of the present disclosure can be variously modified in many different forms. However, the present disclosure is not limited to the following embodiments and may be modified into various forms.

Some elements which are not directly related to the features of the present disclosure in the drawings may be omitted to more clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanations will be omitted.

It will be understood that, although the terms "first", "second", etc. may be used herein to describe various elements, these elements should not be limited by these terms. It will be further understood that the terms "comprise", "include", "have", etc. when used in this specification, specify the presence of stated features, integers, steps, operations, elements, components, and/or combinations thereof, but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the terms "position", "direction", etc. used in the following description are defined in relative terms, and it should be noted that they may be changed into a reverse position or direction depending on a view angle or direction.

Embodiments and required details of the present disclosure are described with reference to the accompanying drawings in order to describe the present disclosure in more detail so that those having ordinary knowledge in the technical field to which the present disclosure pertains can easily practice the present disclosure. Furthermore a singular form may include a plural from as long as it is not specifically mentioned in s sentence.

FIGS. 1A, 1B, 2A, 2B, 3A, and 3B are perspective views and sectional views illustrating light emitting diodes LD in accordance with embodiments of the present disclosure. Although FIGS. 1A to 3B illustrate that each light emitting diode LD is a cylindrical rod-type (rod-shaped) light emitting diode, the kind and/or shape of the light emitting diode LD in accordance with the present disclosure is not limited thereto.

Figure 1B:
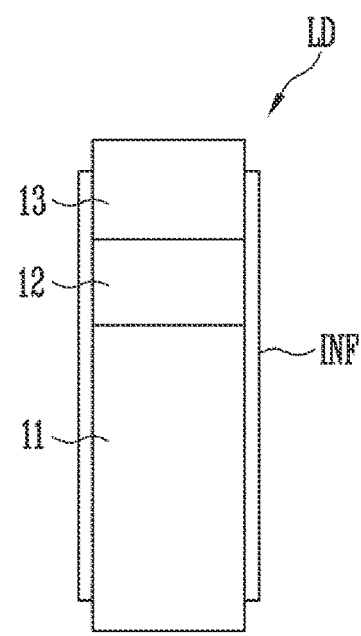

Referring to FIGS. 1A and 1B, a light emitting diode (or also referred to as "light emitting element") LD in accordance with an embodiment of the present disclosure may include a first conductivity type semiconductor layer 11 (or also referred to as "first semiconductor layer"), a second conductivity type semiconductor layer 13 (or also referred to as "second semiconductor layer"), and an active layer 12 interposed between the first and second conductivity type semiconductor layers 11 and 13. For example, the light emitting diode LD may be configured (formed) as a stacked body formed by successively stacking the first conductivity type semiconductor layer 11, the active layer 12, and the second conductivity type semiconductor layer 13.

In an embodiment, the light emitting diode LD may be provided in the form (shape) of a rod extending in one direction. If the direction in which the light emitting diode LD extends is defined as a longitudinal direction, the light emitting diode LD may have a first end and a second end with respect to the longitudinal direction.

In an embodiment, one of the first and second conductivity type semiconductor layers 11 and 13 may be disposed at the first end of the light emitting diode LD, and the other of the first and second conductivity type semiconductor layers 11 and 13 may be disposed at the second end of the light emitting diode LD.

In an embodiment, the light emitting diode LD may be a rod-type (rod-shaped) light emitting diode manufactured in the form of a rod. In this specification, the term "rod-type" refers to a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, a length L of the light emitting diode LD may be greater than a diameter D thereof (or a width of the cross-section thereof).

In an embodiment, the light emitting diode LD may have a small size corresponding to a range from a nano-scale size to a micro-scale size, e.g., a diameter D and/or a length L of the light emitting diode LD corresponding to a range from a nano-scale size to a micro-scale size. However, in the present disclosure, the size of the light emitting diode LD is not limited thereto. For example, the size of the light emitting diode LD may be changed in various ways depending on design conditions of various devices, e.g., a display device, which employs, as a light source, a light emitting device using a light emitting diode LD.

The first conductivity type semiconductor layer 11 may include, for example, at least one n-type semiconductor layer. For instance, the first conductivity type semiconductor layer 11 may include an n-type semiconductor layer, which includes a semiconductor material selected from InAlGaN, GaN, AlGaN, InGaN, AlN, and InN, and is doped with a first conductive dopant such as Si, Ge, or Sn. However, the material forming the first conductivity type semiconductor layer 11 is not limited to this, and the first conductivity type semiconductor layer 11 may be formed of various other suitable materials.

The active layer 12 may be disposed on the first conductivity type semiconductor layer 11 and may have a single or multiple quantum well structure. In an embodiment, a cladding layer (not illustrated) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other suitable materials may be used to form the active layer 12.

If an electric field of a predetermined (or set) voltage or more is applied to the opposite ends of the light emitting diode LD, the light emitting diode LD emits light by combination of electron-hole pairs in the active layer 12. Since light emission of the light emitting diode LD can be controlled based on the foregoing principle, the light emitting diode LD may be used as a light source for various light emitting devices as well as a pixel of a display device.

The second conductivity type semiconductor layer 13 may be disposed on the active layer 12 and induce a semiconductor layer of a type (or kind) different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes a semiconductor material selected from InAlGaN, GaN, AlGaN, InGaN, AlN, and InN, and is doped with a second conductive dopant such as Mg. However, the material forming the second conductivity type semiconductor layer 13 is not limited to this, and the second conductivity type semiconductor layer 13 may be formed of various other suitable materials.

In an embodiment, the light emitting diode LD may further include an insulating film INF provided on the surface of the light emitting diode LD. In an embodiment, the insulating film INF may be formed on the surface of the light emitting diode LD to enclose an outer circumferential surface of at least the active layer 12. In addition, the insulating film INF may further enclose at least an area (a portion) of each of the first and second conductivity type semiconductor layers 11 and 13. Here, the insulating film INF may allow the opposite ends of the light emitting diode LD that have different polarities to be exposed to the outside. For example, the insulating film INF may expose one end of each of the first and second conductivity type semiconductor layers 11 and 13 that are disposed on the respective opposite ends of the light emitting diode LD with respect to the longitudinal direction, and, e.g., may expose each of the top and bottom surfaces of the cylinder rather than covering it.

In an embodiment, the insulating film INF may include at least one insulating material selected from $SiO_2$, $Si_3N_4$, $Al_2O_3$, and $TiO_2$, but it is not limited thereto. In other words, the material forming the insulating film INF is not limited to a particular material, and the insulating film INF may be formed of various suitable insulating materials.

In an embodiment, the light emitting diode LD may further include additional other components, in addition to the first conductivity type semiconductor layer 11, the active layer 12, the second conductivity type semiconductor layer 13, and/or the insulating film INF. For example, the light emitting diode LD may further include at least one fluorescent layer, at least one active layer, at least one semiconductor layer and/or at least one electrode layer disposed on one end (or side) of the first conductivity type semiconductor layer 11, the active layer 12, and/or the second conductivity type semiconductor layer 13.

Figure 2A:
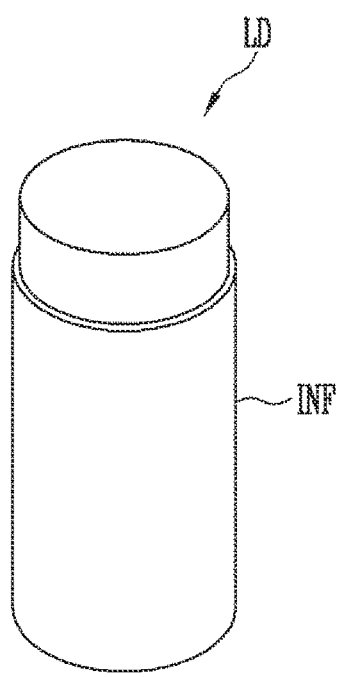
FIGS. 2A and 2B are respectively a perspective view and a sectional view illustrating a light emitting diode in accordance with an embodiment of the present disclosure.
Figure 2B:
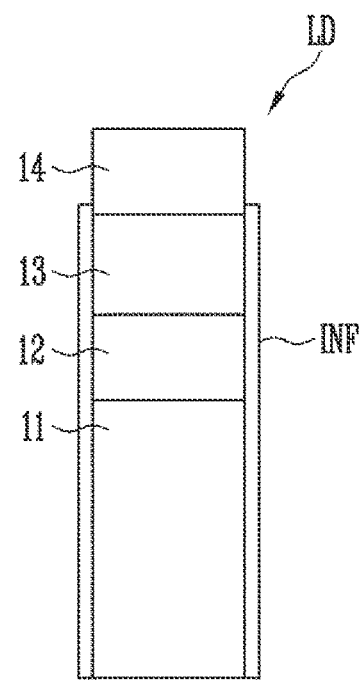
Figure 3A:
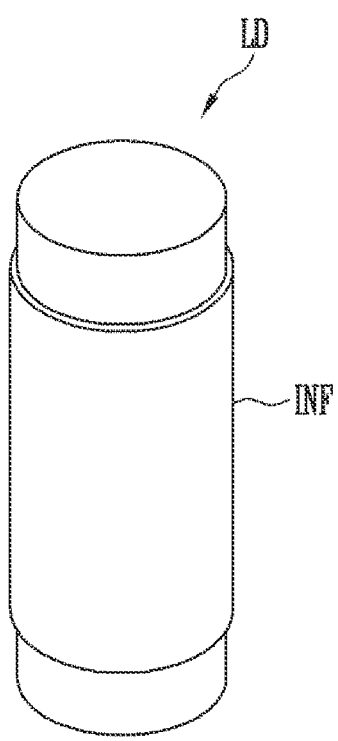
Figure 3B:
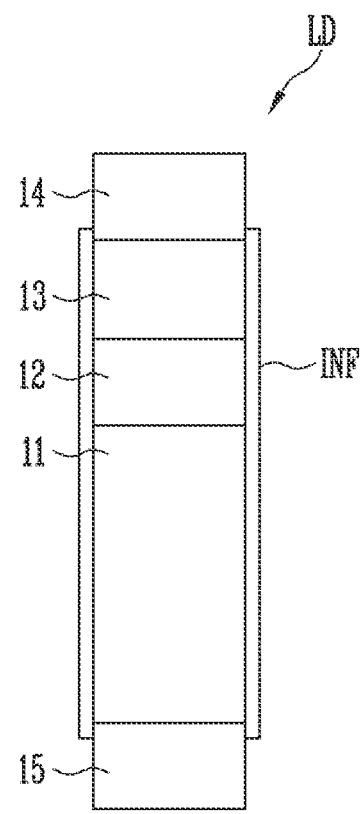

For example, as illustrated in FIGS. 2A and 2B, the light emitting diode LD may further include at least one electrode layer 14 disposed (positioned) on one end of the second conductivity type semiconductor layer 13. In an embodiment, as illustrated in FIGS. 3A and 3B, the light emitting diode LD may further include at least one electrode layer 15 disposed on one end of the first conductivity type semiconductor layer 11.

Each of the electrode layers 14 and 15 may be an ohmic contact electrode, but it is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Thereby, light generated from the light emitting diode LD may be emitted out of the light emitting diode LD after passing through the electrode layers 14 and 15.

In an embodiment, the insulating film INF may at least partially enclose the outer surfaces of the electrode layers 14 and 15, or may not enclose them. In other words, the insulating film INF may be selectively formed on the surfaces of the electrode layers 14 and 15. Furthermore, the insulating film INF may be formed to expose the opposite ends of the light emitting diode LD that have different polarities, and, for example, may expose at least an area of each of the electrode layers 14 and 15. Alternatively, in an embodiment, the insulating film INF may not be provided.

If the insulating film INF is provided on the surface of the light emitting diode LD, particularly, on the surface of the active layer 12, the active layer 12 may be prevented or reduced from short-circuiting with at least one electrode (not illustrated), e.g., at least one contact electrode of contact electrodes connected to the opposite ends of the light emitting diode LD, etc. Consequently, the electrical stability of the light emitting diode LD may be secured.

Furthermore, due to the insulating film INF formed on the surface of the light emitting diode LD, occurrence of a defect on the surface of the light emitting diode LD may be minimized or reduced, whereby the lifetime and efficiency of the light emitting diode LD may be improved. In addition, if the insulating film INF is formed on each light emitting diode LD, even when a plurality of light emitting diodes LD are disposed adjacent to each other, the light emitting diodes LD may be prevented or reduced from undesirably short-circuiting.

In an embodiment of the present disclosure, a surface treatment process may be performed to fabricate the light emitting diode LD. For example, the light emitting diode LD may be surface-treated (e.g., through a coating process) so that, when a plurality of light emitting diodes LD are mixed with a fluidic solution and then supplied to each light emitting area (e.g., a light emitting area of each pixel), the light emitting diodes LD can be evenly distributed rather than unevenly aggregating in the solution.

The above-described light emitting diode LD may be used in various suitable devices including a display device which requires a light source. For instance, at least one subminiature light emitting diode LD, e.g., a plurality of subminiature light emitting diodes LD each having a size ranging from a nano scale to a micro scale, may be disposed in each pixel area of a display panel so as to form a light source (or, a light source unit) of the corresponding pixel. Furthermore, the field of application of the light emitting diode LD according to the present disclosure is not limited to a display device. For example, the light emitting diode LD may also be used in various suitable devices such as a lighting device, which requires a light source.

Figure 4:
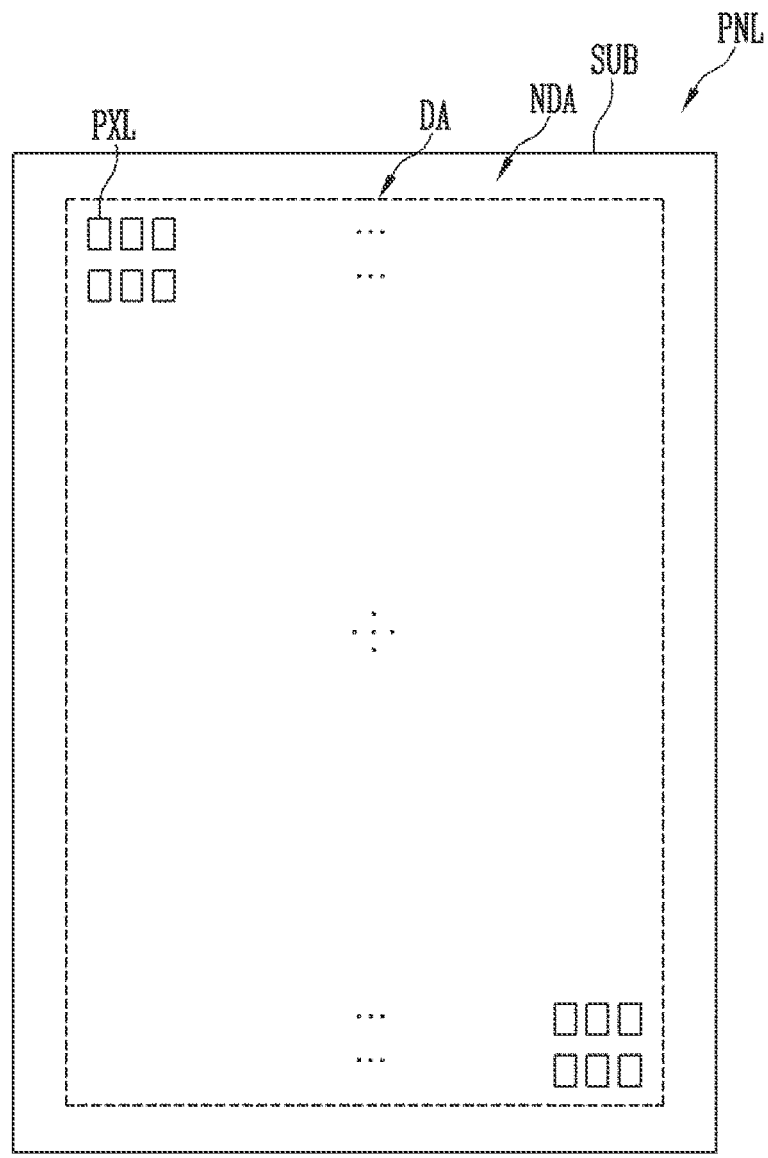
FIG. 4 is a plan view illustrating a display device in accordance with an embodiment of the present disclosure.

FIG. 4 is a plan view illustrating a display device in accordance with an embodiment of the present disclosure. In an embodiment, FIG. 4 illustrates a display panel PNL provided in the display device, as an example of a device which may use, as a light source, the light emitting diode LD described with reference to FIGS. 1A to 3B. For example, pixels PXL of the display panel PNL each may include a light emitting device. The light emitting device may include at least one light emitting diode LD.

For convenience of explanation, FIG. 4 simply illustrates the structure of the display panel PNL having a display area DA, in accordance with an embodiment of the present disclosure. In some embodiments, although not illustrated, at least one driving circuit unit (e.g., at least one of a scan driver and a data driver) and/or a plurality of lines may be further provided on the display panel PNL.

Referring to FIG. 4, the display panel PNL in accordance with an embodiment of the present disclosure may include a substrate SUB, and a plurality of pixels PXL disposed on the substrate SUB. The display panel PNL and the substrate SUB for forming the display panel PNL may include a display area DA for displaying an image, and a non-display area NDA formed in a predetermined (or set) area, other than the display area DA. The pixels PXL may be disposed in the display area DA on the substrate SUB.

In an embodiment, the display area DA may be disposed (located) in a central portion of the display panel PNL, and the non-display area NDA may be disposed in a perimeter portion of the display panel PNL in such a way as to enclose the display area DA. The locations of the display area DA and the non-display area NDA are not limited to this, and the locations thereof may be changed.

The substrate SUB may form a base member (a base) of the display panel PNL. In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

An area (a portion) on the substrate SUB is defined as the display area DA in which the pixels PXL are disposed, and the other area thereof is defined as the non-display area NDA. For example, the substrate SUB may include the display area DA including a plurality of pixel areas in which the respective pixels PXL are formed, and the non-display area NDA disposed around the display area DA. Various lines and/or internal circuit units which are connected to the pixels PXL may be disposed in the non-display area NDA.

In an embodiment, the pixels PXL may be distributed and arranged in the display area DA. In an embodiment, the pixels PXL may be arranged in a stripe shape in the display area DA. However, the present disclosure is not limited thereto. For example, the pixels PXL may be arranged in various suitable shapes in the display area DA.

Each pixel PXL may include at least one light source, which is driven by a predetermined (or set) control signal (e.g., a scan signal and a data signal) and/or power (e.g., first and second power). For example, the at least one light source may be the light emitting diode LD according to any one of the embodiments of FIGS. 1A to 3B. For example, each pixel PXL may include at least one light emitting diode LD having a small size ranging from a nano scale to a micro scale. For instance, each pixel PXL may Include a plurality of rod-type (rod-shaped) light emitting diodes which are connected in parallel between pixel electrodes and/or power lines. The plurality of rod-type (rod-shaped) light emitting diodes may form a light emitting device (e.g., a light source or a light source unit) of the corresponding pixel PXL. In an embodiment, each light emitting diode LD may be a red, green, or blue light emitting diode, but the present disclosure is not limited thereto.

In an embodiment, each pixel PXL may be formed of an active pixel. However, the types, structures and/or driving schemes of the pixels PXL capable of being applied to the display device according to the present disclosure are not particularly limited. For example, each pixel PXL may have the same structure as that of a pixel of various suitable passive or active light emitting display devices.

FIGS. 5A-5E each are a circuit diagram illustrating different examples of an active pixel PXL including a light emitting device in accordance with one or more embodiments of the present disclosure. In an embodiment, each pixel PXL illustrated in FIGS. 5A to 5E may be any one of the pixels PXL provided in the display panel PNL of FIG. 4. The pixels PXL may have substantially identical or similar structures.

Figure 5A:
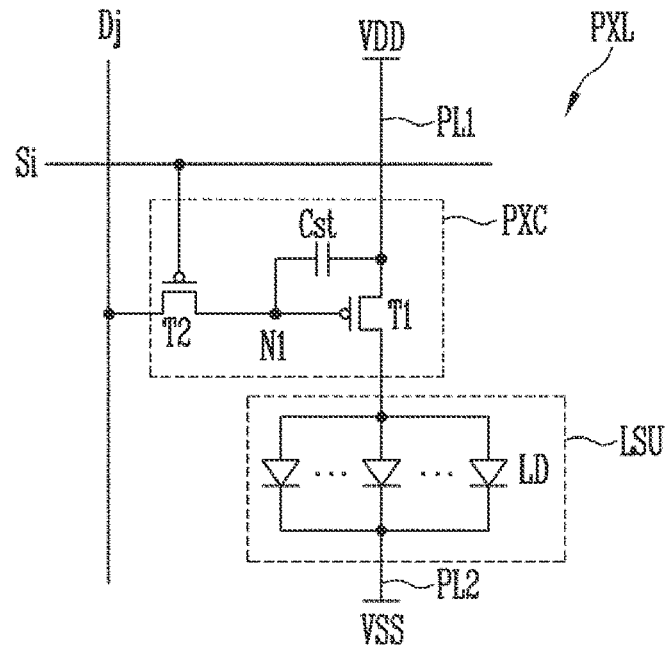
FIGS. 5A-E each are a circuit diagram illustrating different examples of an active pixel including a light emitting device in accordance with one or more embodiments of the present disclosure.

Referring to FIG. 5A, the pixel PXL in accordance with an embodiment of the present disclosure may include a light source unit LSU configured to generate light having a luminance corresponding to a data signal, and a pixel circuit PXC configured to drive the light source unit LSU. The light source unit LSU may form a light emitting device in accordance with an embodiment of the present disclosure.

In an embodiment, the light source unit LSU may include a plurality of light emitting diodes LD connected parallel to each other (in parallel) between a first power supply VDD and a second power supply VSS. Here, the first and second power supplies VDD and VSS may have different potentials to make it possible for the light emitting diodes LD to emit light. For example, the first power supply VDD may be set as a high-potential power supply, and the second power supply VSS may be set as a low-potential power supply. Here, a difference in potential between the first and second power supplies VOD and VSS may be set to a threshold voltage of the light emitting diodes LD or more during at least a light emitting period of the pixel PXL.

Although FIG. 5A illustrates an embodiment in which the light emitting diodes LD forming the light source unit LSU of each pixel PXL are connected in parallel to each other in the same direction (e.g., in a forward direction) between the first power supply VDD and the second power supply VSS, the present disclosure is not limited to this. For example, in an embodiment, some of the light emitting diodes LD may be connected to each other in a first direction (e.g., the forward direction) between the first and second power supplies VDD and VSS, and the other light emitting diodes LD may be connected to each other in a second direction (e.g., the reverse direction). In an embodiment, at least one pixel PXL may include only a single light emitting diode LD.

In an embodiment, first ends of the light emitting diodes LD forming each light source unit LSU may be connected in common to a corresponding pixel circuit PXC through a first electrode of the light source unit LSU, and may be connected to the first power supply VOD through the pixel circuit PXC and a first power line PL1. Second ends of the light emitting diodes LD may be connected in common to the second power supply VSS through a second electrode of the light source unit LSU and a second power line PL2.

Each light source unit LSU may emit light having a luminance corresponding to driving current supplied thereto through the corresponding pixel circuit PXC. Thereby, a predetermined (desired) image may be displayed in the display area DA.

The pixel circuit PXC may be connected to a scan line Si and a data line Dj of the corresponding pixel PXL. For example, if the pixel PXL is disposed on an i-th row (where "i" is a natural number) and a j-th column (where "j" is a natural number) of the display area DA, the pixel circuit PXC of the pixel PXL may be connected to an i-th scan line Si and a j-th data line Dj of the display area DA. The pixel circuit PXC may include a first transistor T1, a second transistor T2, and a storage capacitor Cst.

The first transistor (driving transistor) 11 is connected between the first power supply VDD and the first electrode of the light source unit LSU. A gate electrode of the first transistor T1 is connected to a first node N1. The first transistor T1 may control driving current to be supplied to the light source unit LSU in response to a voltage of the first node N1.

The second transistor (switching transistor) T2 may be connected between the data line Dj and the first node N1. A gate electrode of the second transistor T2 is connected to the scan line Si.

When a scan signal of a gate-on voltage (e.g., a low voltage) is supplied from the scan line Si, the second transistor T2 is turned on to electrically connect the first node N1 to the data line Dj. During each frame period, a data signal of a corresponding frame is supplied to the data line Dj. The data signal is transmitted to the first node N1 via the second transistor T2. Thereby, a voltage corresponding to the data signal is charged to the storage capacitor Cst.

One electrode of the storage capacitor Cst is connected to the first power supply VDD, and the other electrode thereof is connected to the first node N1. The storage capacitor Cst may charge voltage corresponding to a data signal supplied to the first node N1 during each frame period, and maintain the charged voltage until a data signal of a subsequent frame is supplied.

Although in FIG. 5A the transistors, e.g., the first and second transistors T1 and T2, included in the pixel circuit PXC have been illustrated as being formed of P-type transistors, the present disclosure is not limited to this. Any of the first and second transistors T1 and T2 may be changed to an N-type transistor.

Figure 5B:
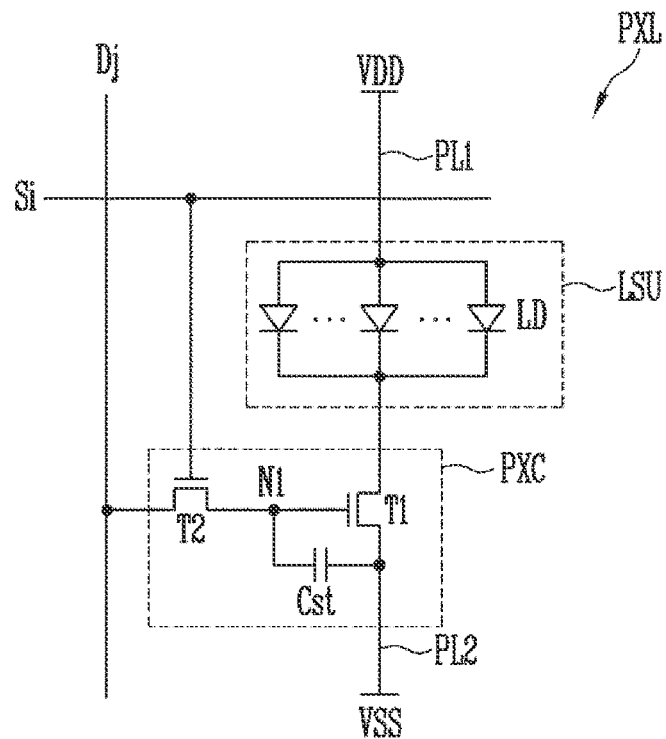

For example, as illustrated in FIG. 5B, both the first and second transistors T1 and T2 may be formed of N-type transistors. The configuration and operation of the pixel PXL illustrated in FIG. 5B are substantially similar to those of the pixel PXL of FIG. 5A, except that connection positions of some circuit elements have been changed depending on a change in type of the transistors. Therefore, duplicative descriptions of the elements of the pixel PXL of FIG. 5B will not be provided.

The structure of the pixel circuit PXC is not limited to the embodiments shown in FIGS. 5A and 5B. In other words, the pixel circuit PXC may be formed as any suitable pixel circuit which may have various suitable structures and/or be operated by various suitable driving schemes. For example, the pixel circuit PXC may be configured in the same manner as that of an embodiment illustrated in FIG. 5C.

Figure 5C:
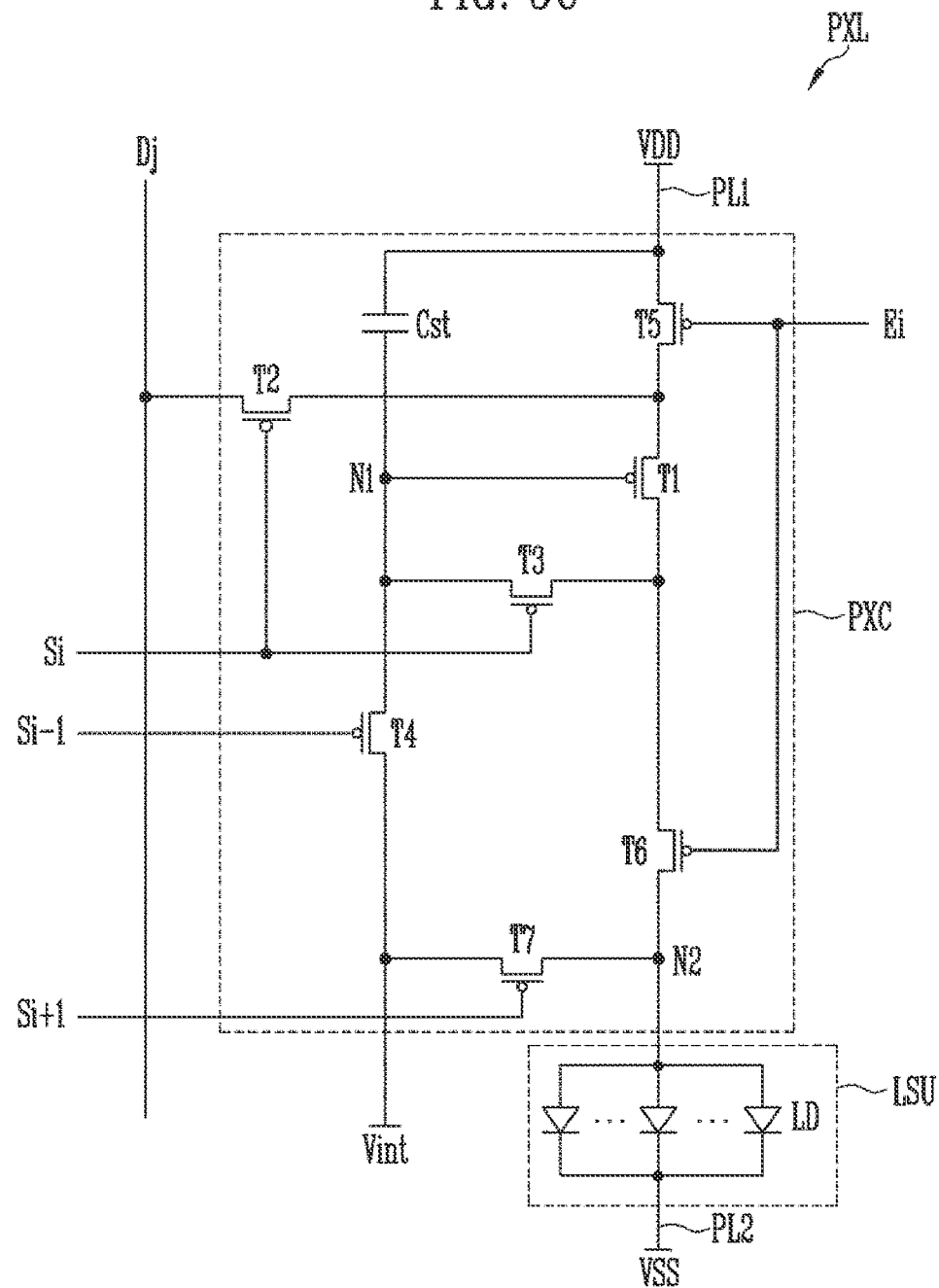

Referring to FIG. 5C, the pixel circuit PXC may be connected not only to a scan line Si of a corresponding horizontal line but also to at least one another scan line (or a control line). For example, the pixel circuit PXC of the pixel PXL disposed on the i-th row of the display area DA may be further connected to an i−1-th scan line Si−1 and/or an i+-th scan line Si+1. In an embodiment, the pixel circuit PXC may be connected not only to the first and second power supplies VDD and VSS but also to other power supplies. For instance, the pixel circuit PXC may also be connected to an initialization power supply Vint. In an embodiment, the pixel circuit PXC may include first to seventh transistors T1 to T7 and a storage capacitor Cst.

The first transistor T1 is connected between the first power supply VDD and the first electrode of the light source unit LSU. A gate electrode of the first transistor T1 is connected to a first node N1. The first transistor T1 may control driving current to be supplied to the light source unit LSU in response to a voltage of the first node N1.

The second transistor T2 is connected between the data line Dj and one electrode of the first transistor T1. A gate electrode of the second transistor T2 is connected to the corresponding scan line Si. When a scan signal of a gate-on voltage is supplied from the scan line Si, the second transistor T2 may be turned on to electrically connect the data line Dj to the one electrode of the first transistor T1. Hence, if the second transistor T2 is turned on, a data signal supplied from the data line Dj may be transmitted to the first transistor T1.

The third transistor 13 is connected between the other electrode of the first transistor T1 and the first node N1. A gate electrode of the third transistor T3 is connected to the corresponding scan line Si. When a scan signal of a gate-on voltage is supplied from the scan line Si, the third transistor T3 may be turned on to electrically connect the first transistor T1 in the form of a diode.

The fourth transistor T4 may be connected between the first node N1 and an initialization power supply Vint. A gate electrode of the fourth transistor T4 is connected to a preceding scan line, e.g., an i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 is connected between the first power supply VDD and the first transistor T1. A gate electrode of the fifth transistor T5 is connected to a corresponding emission control line, e.g., an i-th emission control line Ei. The fifth transistor T5 may be turned off when an emission control signal of a gate-off voltage (e.g., a high voltage) is supplied to the emission control line Ei, and may be turned on in other cases.

The sixth transistor T6 is connected between the first transistor T1 and the first electrode of the light source unit LSU. A gate electrode of the sixth transistor T6 is connected to a corresponding emission control line, e.g., the i-th emission control line Ei. The sixth transistor T6 may be turned off when an emission control signal of a gate-off voltage is supplied to the emission control line Ei, and may be turned on in other cases.

The seventh transistor T7 is connected between the first electrode of the light source unit LSU and the initialization power supply Vint. A gate electrode of the seventh transistor T7 is connected to any one of scan lines of a subsequent stage, e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first electrode of the light source unit LSU.

The storage capacitor Cst is connected between the first power supply VDD and the first node N1. The storage capacitor Cst may store a voltage corresponding both to the data signal applied to the first node N1 during each frame period and to the threshold voltage of the first transistor T1.

Although in FIG. 5C the transistors, e.g., the first to seventh transistors T1 to T7, included in the pixel circuit PXC have been illustrated as being formed of P-type transistors, the present disclosure is not limited to this. For example, at least one of the first to seventh transistors T1 to T7 may be changed to an N-type transistor.

The structure of the pixel PXL which may be applied in embodiments of the present disclosure is not limited to the embodiments illustrated in FIGS. 5A through 5C, and each pixel PXL may have various suitable structures. For example, the pixel circuit PXC included in each pixel PXL may be formed of a suitable pixel circuit which may have various suitable structures and/or be operated by various suitable driving schemes. In an embodiment of the present disclosure, each pixel PXL may be configured in s passive light emitting display device, or the like. In this case, the pixel circuit PXC may be omitted, and each of the first and second electrodes of the light source unit LSU may be directly connected to the scan line Si, the data line Dj, a power line, and/or the control line.

Figure 5D:
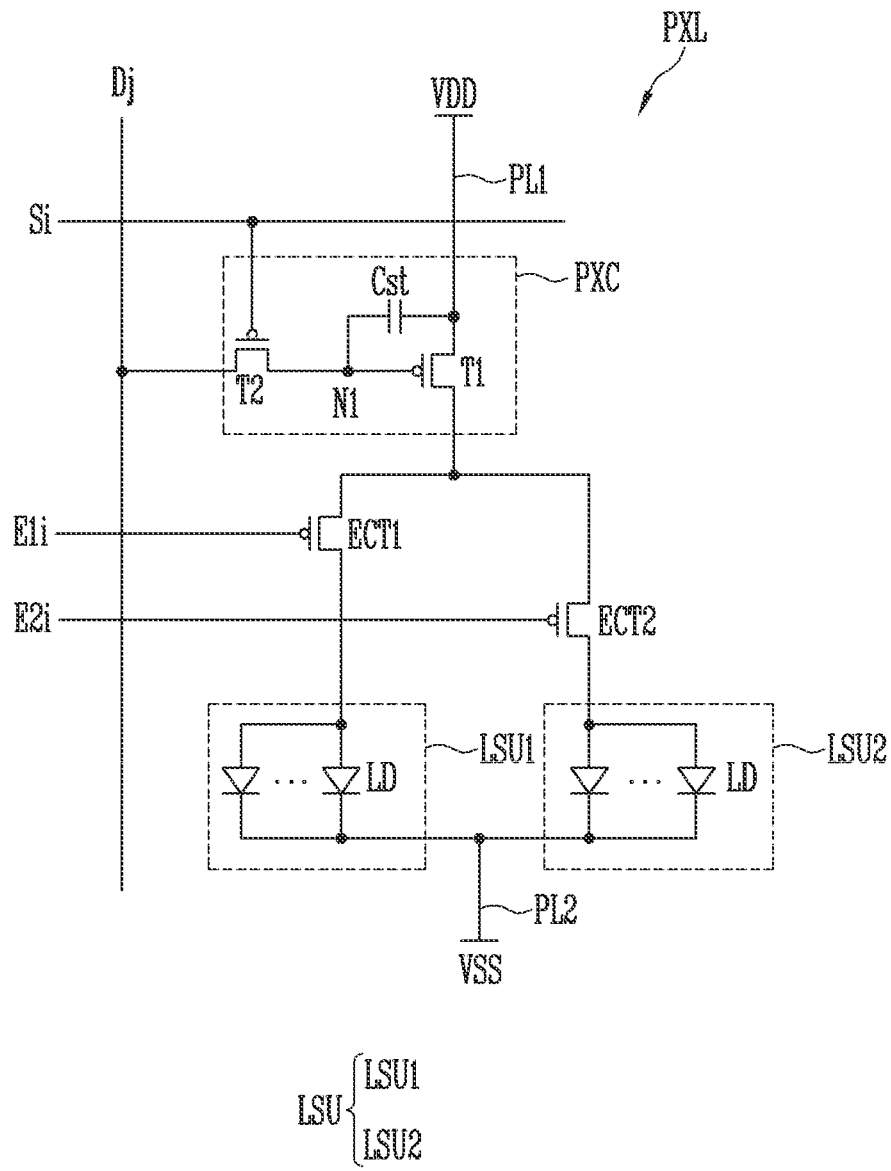

In an embodiment of the present disclosure, each pixel PXL may include a plurality of light source units LSU which can independently emit light. For example, each pixel PXL may include a plurality of light source units LSU, as illustrated in FIG. 5D. Alternatively, as illustrated in FIG.

Figure 5E:
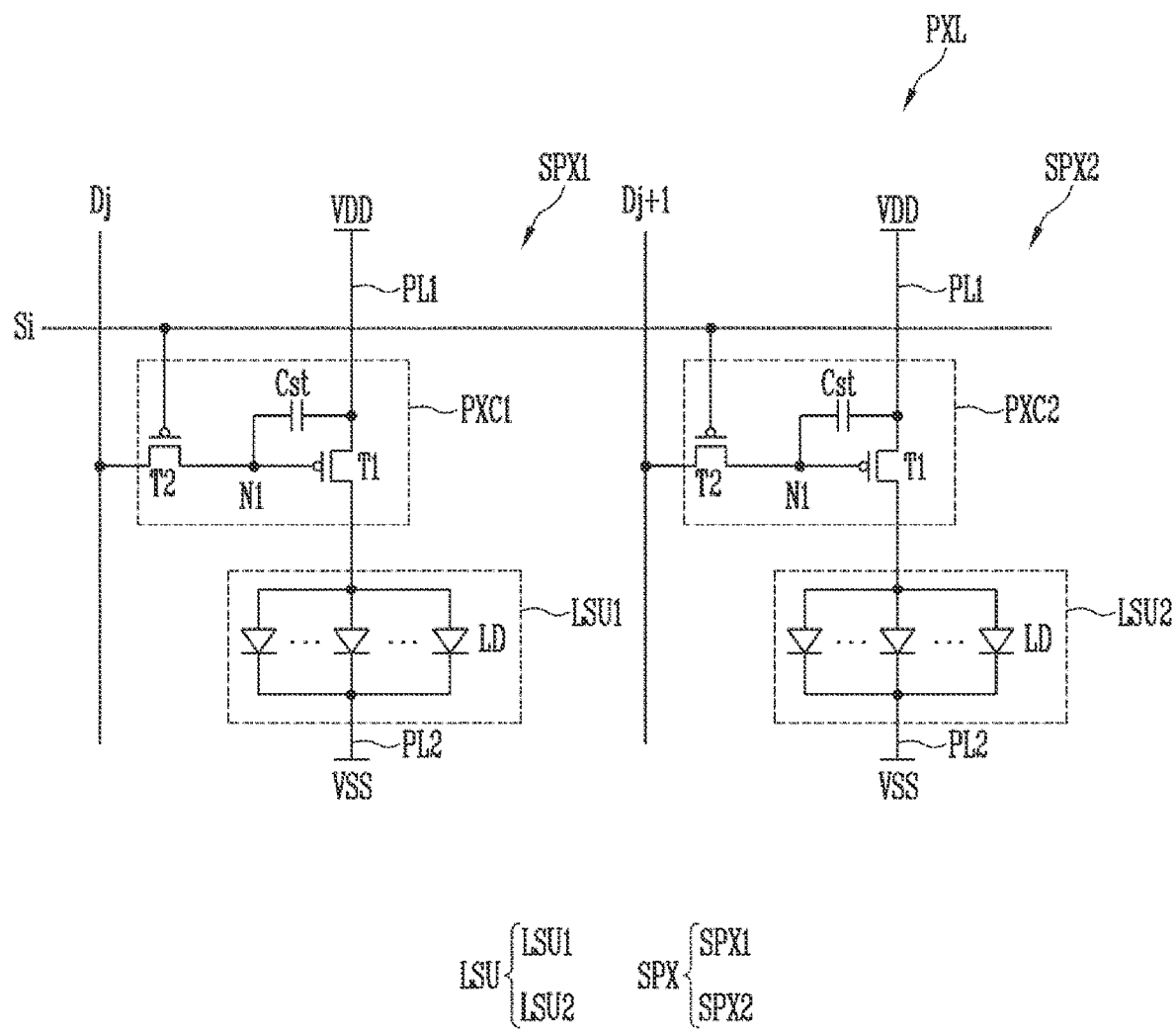

5E, each pixel PXL may include a plurality of sub-pixels SPX each of which includes a light source unit LSU, as illustrated in FIG. 5E.

Referring to FIG. 5D, each pixel PXL may include a first light source unit LSU1 and a second light source unit LSU2 which are connected in parallel to each other between the pixel circuit PXC and the second power supply VSS. In an embodiment, the first and second light source units LSU1 and LSU2 may form the light source unit LSU of the corresponding pixel PXL.

Furthermore, the pixel PXL may further include a first emission control transistor ECT1 connected between the pixel circuit PXC and the first light source unit LSU1, and a second emission control transistor ECT2 connected between the pixel circuit PXC and the second light source unit LSU2. In an embodiment, the first emission control transistor ECT1 and the second emission control transistor ECT2 may be connected to respective different control lines and be independently driven. For example, the first emission control transistor ECT1 may be connected to an i-th first emission control line E1$i$, and the second emission control transistor ECT2 may be connected to an i-th second emission control line E2$i$. Alternatively, in an embodiment, the first emission control transistor ECT1 and the second emission control transistor ECT2 may be successively or alternately driven. In the case of the above-mentioned embodiment an emission time and/or period of each of the first and second light source units LSU1 and LSU2 may be easily (or suitably) controlled by an emission control signal supplied to each of the i-th first and second emission control lines E1$i$ and E2$i$.

Moreover in an embodiment, a plurality of horizontal lines disposed in the display area DA may share one first emission control line and/or one second emission control line. In this case, the emission times of the first and second light source units LSU1 and LSU2 disposed on (along) the plurality of horizontal lines may be controlled in a batch fashion by respective emission control signals supplied to the first and second emission control lines.

Referring to FIG. 5E, each pixel PXL may include a first sub-pixel SPX1 and a second sub-pixel SPX2 which are connected to different data lines, e.g., respectively, a j-th data line Dj and a j+1-th data line Dj+1. For example, the first and second sub-pixels SPX1 and SPX2 may be successively disposed on (along) any one horizontal line of the display area DA.

In an embodiment, the first sub-pixel SPX1 may include a first pixel circuit PXC1 which is connected to the i-th scan line Si and the j-th data line Dj, and a first tight source unit LSU1 which is driven by the first pixel circuit PXC1. In an embodiment the second sub-pixel SPX2 may include a second pixel circuit PXC2 which is connected to the i-th scan line Si and the j+1-th data line Dj+1, and a second light source unit LSU2 which is driven by the second pixel circuit PXC2. In an embodiment, the first and second light source units LSU1 and LSU2 may form the light source unit LSU of the corresponding pixel PXL. In the case of the above-mentioned embodiment, emission and/or luminance of each of the first and second light source units LSU1 and LSU2 may be easily (suitably) controlled by a corresponding one of data signals which are supplied to the j-th data line Dj and the j+1-th data line Dj+1.

Although FIG. 5E has illustrated the embodiment in which the first sub-pixel SPX1 and the second sub-pixel SPX2 are simultaneously driven by the same scan line, e.g., the i-th scan line Si, the present disclosure is not limited thereto. For example, in an embodiment of the present disclosure, the first sub-pixel SPX1 and the second sub-pixel SPX2 may be connected to respective different scan lines. In this case, the operation, etc. of each of the first and second light source units LSU1 and LSU2 may be easily (suitably) controlled by scan signals supplied to each corresponding scan line.

Figure 7:
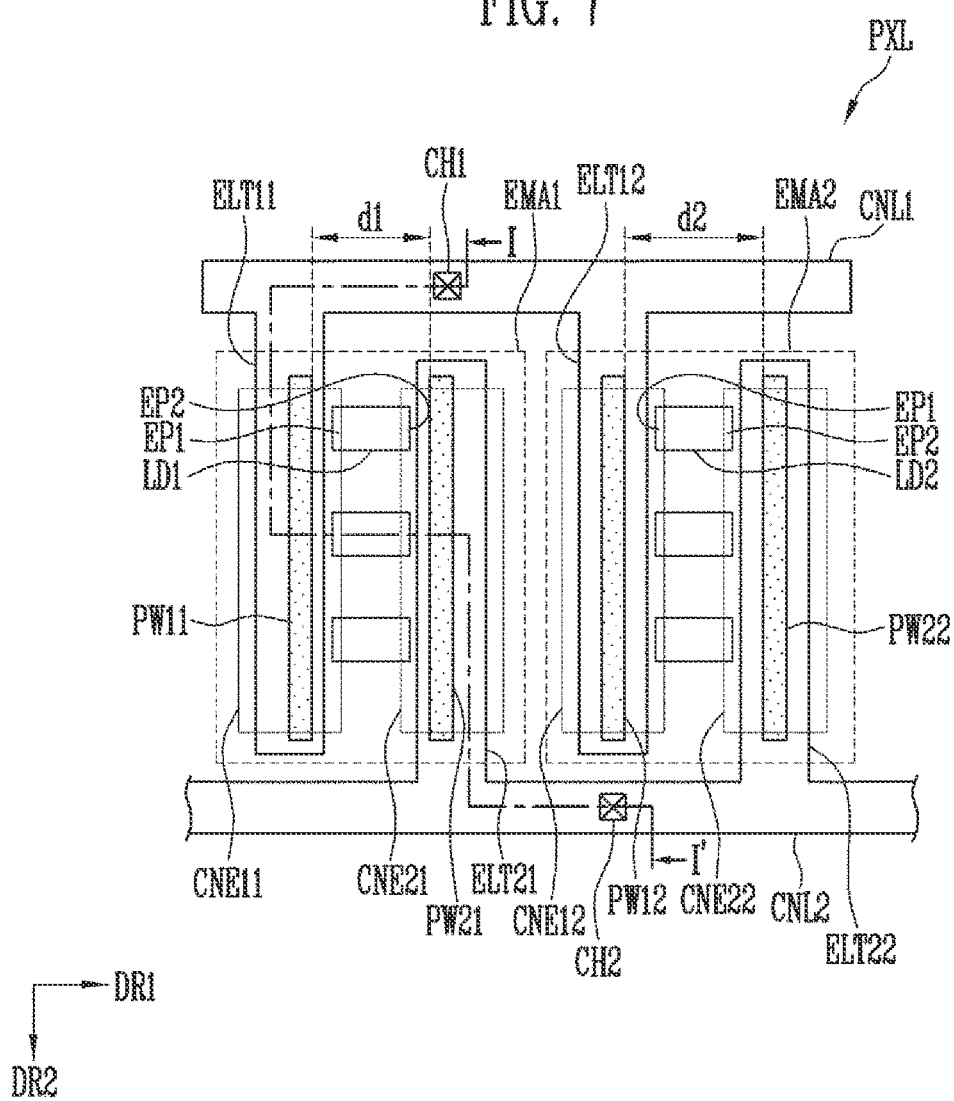

FIGS. 6 and 7 each are a plan view illustrating different examples of a pixel PXL including a light emitting device in accordance with one or more embodiments of the present disclosure. FIG. 6 illustrates an embodiment in which each light emitting device (or a light source unit LSU of each pixel PXL corresponding thereto) includes first and second control lines CL1 and CL2 such as first and second power lines PL1 and PL2 (or a scan line Si and a data line Dj), or is directly connected to the first and second power lines PL1 and PL2. FIG. 7 illustrates an embodiment in which each light emitting device (or a light source unit LSU of each pixel PXL corresponding thereto) is connected to at least one circuit element (e.g., the pixel circuit PXC of FIGS. 5A to 5C), a connection line, a first power line PL1, a second power line PL2, a scan line Si, and/or a data line Dj through a first contact hole CH1 and a second contact hole CH2. In an embodiment, each pixel PXL illustrated in FIGS. 6 and 7 may be a pixel PXL illustrated in each of FIGS. 4 to 5E. The pixels PXL disposed in the display area DA may have substantially identical or similar structure. FIGS. 6 and 7 illustrates the structure of each pixel PXL and the corresponding light source unit LSU.

Referring to FIGS. 6 and 7, the pixel PXL in accordance with an embodiment of the present disclosure may include a plurality of emission areas EMA, including a first emission area EMA1 and a second emission area EMA2, each of which includes at least one light emitting diode LD. In an embodiment, each of the first and second emission areas EMA1 and EMA2 may include at least one pair of first and second partition walls PW1 and PW2. The first and second partition walls PW1 and PW2 may also be referred to as "first and second walls" or "first and second banks", respectively. The at least one pair of first and second partition walls PW1 and PW2 may have different structures in different emission areas EMA.

In an embodiment, the first and second emission areas EMA1 and EMA2 may be disposed adjacent to each other in each pixel area in which a pixel PXL is formed. For example, the first and second emission areas EMA1 and EMA2 may be successively (or alternately) disposed in a first direction DR1 (e.g., in a horizontal direction) in each pixel area.

The first emission area EMA1 may include at least one first light emitting diode LD1. For example, the first emission area EMA1 may include a plurality of first tight emitting diodes LD1 which are connected in parallel to each other between a pair of first and second electrodes ELT1 and ELT2 (e.g., 11-th and 21-st electrodes ELT11 and ELT21, respectively) corresponding to each other. Furthermore, the first emission area EMA1 may include at least one first electrode ELT1 (e.g., the 11-th electrode ELT11) respectively connected to first ends EP1 of the first light emitting diodes LD1, at least one second electrode ELT2 (e.g., the 21-st electrode ELT21) respectively connected to second ends EP2 of the first light emitting diodes LD1, at least one first partition wall PW1 (e.g., an 11-th partition wall PW11) and a first contact electrode CNE1 (e.g., an 11-th contact electrode CNE11) which overlap with each first electrode ELT1, and at least one second partition wall PW2 (e.g., a 21-st partition wall PW21) and a second contact electrode CNE2 (e.g., a 21-st contact electrode CNE21) which overlap with each second electrode ELT2.

Likewise, the second emission area EMA2 may include at least one second light emitting diode LD2. For example, the second emission area EMA2 may include a plurality of second light emitting diodes LD2 which are connected in parallel to each other between a pair of first and second electrodes ELT1 and ELT2 (e.g.: 12-th and 22-nd electrodes ELT12 and ELT22, respectively) corresponding to each other. Furthermore, the second emission area EMA2 may include at least one first electrode ELT1 (e.g., the 12-th electrode ELT12) respectively connected to first ends EP1 of the second light emitting diodes LD2, at least one second electrode ELT2 (e.g., the 22-nd electrode ELT22) respectively connected to second ends EP2 of the second light emitting diodes LD2, at least one first partition wall PW1 (e.g., a 12-th partition wall PW12) and a first contact electrode CNE1 (e.g., a 12-th contact electrode CNE12) which overlap with each first electrode ELT1, and at least one second partition wall PW2 (e.g., a 22-nd partition wall PW22) and a second contact electrode CNE2 (e.g., an 22-nd contact electrode CNE22) which overlap with each second electrode ELT2.

In an embodiment, although FIGS. 6 and 7 illustrate that a pair of first and second partition walls PW1 and PW2, a pair of first and second electrodes EL11 and ELT2, and a pair of first and second contact electrodes CNE1 and CNE2 are disposed in each of the first and second emission areas EMA1 and EMA2, the numbers of first and second partition walls PW1 and PW2, first and second electrodes ELT1 and ELT2, and first and second contact electrodes CNE1 and CNE2 which are disposed in the first and second emission areas EMA1 and EMA2 are not limited thereto. For example, at least one of the first and second emission areas EMA1 and EMA2 each may include at least two pairs of first and second partition walls PW1 and PW2, first and second electrodes ELT1 and ELT2, and first and second contact electrodes CNE1 and CNE2.

A pair of first and second partition walls PW1 and PW2 that correspond to each other may be disposed to face each other in each emission area EMA. For example, the 11-th partition wall PW11 and the 21-st partition wall PW21 may be disposed in pair to face each other in the first emission area EMA1. Likewise, the 12-th partition wall PW12 and the 22-nd partition wall PW22 may be disposed in pair to face each other in the second emission area EMA2.

In an embodiment, each pair of first and second partition walls PW1 and PW2 may be disposed in each emission area EMA at positions spaced apart from each other with respect to the first direction DR1 (e.g., the horizontal direction). Each of the first and second partition walls PW1 and PW2 may extend in a second direction DR2 (e.g., a vertical direction) intersecting with the first direction DR1. For example, the 11-th partition wall PW11 and the 21-st partition wall PW21 may be disposed in the first emission area EMA1 at positions spaced apart from each other with respect to the first direction DR1, and each may extend in the second direction DR2. Likewise, the 12-th partition wall PW12 and the 22-nd partition wall PW22 may be disposed in the second emission area EMA2 at positions spaced apart from each other with respect to the first direction DR1, and each may extend in the second direction DR2.

In an embodiment, the 11-th partition wall PW11 may be disposed under the 11-th electrode ELT11 such that the 11-th partition wall PW11 overlaps with an area of the 11-th electrode ELT11. The 21-st partition wall PW21 may be disposed under the 21-st electrode ELT21 such that the 21-st partition wall PW21 overlaps with an area of the 21-st electrode ELT21. Likewise, the 12-th partition wall PW12 may be disposed under the 12-th electrode ELT12 such that the 12-th partition wall PW12 overlaps with an area of the 12-th electrode ELT12. The 22-nd partition wall PW22 may be disposed under the 22-nd electrode ELT22 such that the 22-nd partition wall PW22 overlaps with an area of the 22-nd electrode ELT22.

The first and second partition walls PW1 and PW2 may be disposed in each emission area EMA at positions spaced apart from each other, and respectively make areas of the first and second electrodes ELT1 and ELT2 protrude upward. For example, the 11-th electrode ELT11 may be disposed on the 11-th partition wall PW11, thus being protruded by the 11-th partition wall PW11 in a third direction (e.g., in a height direction normal (e.g., perpendicular) to a plane defined by the first direction DR1 and the second direction DR2). The 21-st electrode ELT21 may be disposed on the 21-st partition wall PW21, thus being protruded by the 21-st partition wall PW21 in the height direction. The 12-th electrode ELT12 may be disposed on the 12-th partition wall PW12, thus being protruded by the 12-th partition wall PW12 in the height direction. The 22-nd electrode ELT22 may be disposed on the 22-nd partition wall PW22, thus being protruded by the 22-nd partition wall PW22 in the height direction.

A pair of first end second electrodes ELT1 and ELT2 that correspond to each other may be disposed to face each other in each emission area EMA. For example, the 11-th electrode ELT11 and the 21-st electrode ELT21 may be disposed in pair to face each other in the first emission area EMA1. Likewise, the 12-th electrode ELT12 and the 22-nd electrode ELT22 may be disposed in pair to face each other in the second emission area EMA2.

In an embodiment, the pair of first and second electrodes ELT1 and ELT2 may be disposed in each emission area EMA at positions spaced apart from each other with at least one light emitting diode LD interposed therebetween. For example, the 11-th and 21-st electrodes ELT11 and ELT21 may be disposed in the first emission area EMA1 at positions spaced apart from each other with at least one first light emitting diode LD1 interposed therebetween. For example, the 11-th and 21-st electrodes ELT11 and ELT21 may be disposed in the first emission area EMA1 at positions spaced apart from each other by a predetermined (or set) distance with respect to the first direction DR1, and each may extend in the second direction DR2 intersecting with the first direction DR1. Likewise, the 12-th and 22-nd electrodes ELT12 and ELT22 may be disposed in the second emission area EMA2 at positions spaced apart from each other with at least one second light emitting diode LD2 interposed therebetween. For example, the 12-th and 22-nd electrodes ELT12 and ELT22 may be disposed in the second emission area EMA2 at positions spaced apart from each other by a predetermined (or set) distance with respect to the first direction DR1, and each may extend in the second direction DR2. However, the present disclosure is not limited to this. For example, the shapes, and/or the mutual disposition relationship of the first and second electrodes ELT1 and ELT2 may be changed in various suitable ways.

In an embodiment, each first electrode ELT1 may be disposed on the corresponding first partition wall PW1 to cover the first partition wall PW1. Each second electrode ELT2 may be disposed on the corresponding second partition wall PW2 to cover the second partition wall PW2. For example, each 11-th electrode ELT11 may be disposed on the 11-th partition wall PW11 to cover the 11-th partition wall PW11. Each 21-st electrode ELT21 may be disposed on the 21-st partition wall PW21 to cover the 21-st partition wall PW21. Likewise, each 12-th electrode ELT12 may be disposed on the 12-th partition wall PW12 to cover the 12-th partition wall PW12. Each 22-nd electrode ELT22 may be disposed on the 22-nd partition wall PW22 to cover the 22-nd partition wall PW22. Hence, each first electrode EL11 may protrude upward from an area corresponding to the first partition wall PW1. Each second electrode ELT2 may protrude upward from an area corresponding to the second partition wall PW2.

In an embodiment, each first electrode ELT1 may be electrically connected to the first end EP1 of at least one light emitting diode LD. For example, the 11-th electrode ELT11 may be electrically connected to the first end EP1 of at least one first light emitting diode LD1. The 12-th electrode ELT12 may be electrically connected to the first end EP1 of at least one second light emitting diode LD2.

Each first electrode ELT1 may be connected to a predetermined or set power line, control line, circuit element, or the like through a first connection electrode CNL1 of the corresponding pixel PXL. For example, the 11-th electrode ELT11 and the 12-th electrode ELT12 are electrically connected to each other via the first connection electrode CNL11, and may be connected to a predetermined or set power line, control line, circuit element, or the like through the first connection electrode CNL1. In an embodiment, in the case where the 11-th electrode ELT11, the 12-th electrode ELT12, and the first connection electrode CNL1 are connected to each other, they may be regarded as a single integrated first electrode ELT1. For convenience of explanation, in this embodiment, the first electrode ELT1 that is disposed in the first emission area EMA1 will be referred to as "11-th electrode ELT11", and the first electrode ELT1 that is disposed in the second emission area EMA2 will be referred to as "12-th electrode ELT12". Furthermore, the 11-th electrode ELT11 and the 12-th electrode ELT12 will be collectively referred to as "first electrode ELT1". A part connecting the 11-th electrode ELT11 and the 12-th electrode ELT12 to each other will be referred to as "first connection electrode CNL1".

In an embodiment, the first electrode ELT1 and the first connection electrode CNL1 may extend in different directions in the corresponding pixel area. For example, when the first connection electrode CNL1 extends in the first direction DR1, each first electrode ELT1 may extend in the second direction DR2 intersecting with the first direction DR1.

In an embodiment, as illustrated in FIG. 6, the first electrode ELT1 may be integrally or non-integrally connected to the first power line PL1 or a predetermined (or set) first control line CL1 (e.g., the scan line Si or the data line Dj) through the first connection electrode CNL1. In an embodiment, as illustrated in FIG. 7, the first electrode ELT1 may be non-integrally connected to a predetermined (or set) circuit element (e.g., the first transistor T1 or the like of the pixel circuit PXC) and/or the first power line PL1 through the first connection electrode CNL1 and the first contact hole CH1.

In an embodiment, the first electrode ELT1 may be integrally connected with the first connection electrode CNL1. For instance, the first electrode ELT1 may be formed to diverge from the first connection electrode CNL1. In the case where the first electrode ELT1 and the first connection electrode CNL1 are integrally connected to each other, the first connection electrode CNL1 may be regarded as an area of the first electrode ELT1. However, the present disclosure is not limited thereto. For example, in an embodiment, the first electrode ELT1 and the first connection electrode CNL1 may be electrically connected to each other via at least one contact hole or the like.

In an embodiment, the first electrode ELT1 and/or the first connection electrode CNL1 may have a single-layer structure or a multi-layer structure. For example, the first electrode ELT1 and/or the first connection electrode CNL1 may be formed of a single reflective conductive layer. In some embodiments, the first electrode ELT1 and/or the first connection electrode CNL1 may be formed of multiple layers including at least one reflective conductive layer, and at least one transparent conductive layer stacked over and/or under the reflective conductive layer.

In an embodiment, at least one conductive capping layer may be disposed over the first electrode ELT1 and/or the first connection electrode CNL1. In an embodiment, the conductive capping layer may include a transparent conductive layer, but the present disclosure is not limited thereto.

In an embodiment, each second electrode ELT2 may be electrically connected to the second end EP2 of at least one light emitting diode LD. For example, the 21-st electrode ELT21 may be electrically connected to the second end EP2 of at least one first light emitting diode LD1. The 22-nd electrode ELT22 may be electrically connected to the second end EP2 of at least one second light emitting diode LD2.

Each second electrode ELT2 may be connected to a predetermined (or set) power line, control line, circuit element, or the like through the second connection electrode CNL2 of the corresponding pixel PXL. For example, the 21-st electrode ELT21 and the 22-nd electrode ELT22 are electrically connected to each other via the second connection electrode CNL2, and may be connected to a predetermined (or set) power line, control line, circuit element, or the like through the second connection electrode CNL2. In an embodiment, in the case where the 21-st electrode ELT21, the 22-nd electrode ELT22, and the second connection electrode CNL2 are connected to each other they may be regarded as a single integrated second electrode ELT2. For convenience of explanation, in this embodiment, the second electrode ELT2 that is disposed in the first emission area EMA1 will be referred to as "21-st electrode ELT21", and the second electrode ELT2 that is disposed in the second emission area EMA2 will be referred to as "22-nd electrode ELT22." Furthermore, the 21-st electrode ELT21 and the 22-nd electrode ELT22 will be collectively referred to as "second electrode ELT2". A part connecting the 21-st electrode ELT21 and the 22-nd electrode ELT22 will be referred to as "second connection electrode CNL2".

In an embodiment, the second electrode ELT2 and the second connection electrode CNL2 may extend in different directions in the corresponding pixel area. For example, when the second connection electrode CNL2 extends in the first direction DR1, each second electrode ELT2 may extend in the second direction DR2.

In an embodiment, as illustrated in FIG. 6, the second electrode ELT2 may be integrally or non-integrally connected to the second power line PL2 or a predetermined (or set) second control line CL2 (e.g., a scan line Si or a data line Dj) through the second connection electrode CNL2. In an embodiment, as illustrated in FIG. 7, the second electrode ELT2 may be non-integrally connected to a predetermined (or set) circuit element, a connection line, and/or the second power line PL2 through the second connection electrode CNL2 and the second contact hole CH2.

In an embodiment, the second electrode ELT2 may be integrally connected with the second connection electrode CNL2. For instance, the second electrode ELT2 may be formed to diverge from the second connection electrode CNL2. In the case where the second electrode ELT2 and the second connection electrode CNL2 are integrally connected to each other, the second connection electrode CNL2 may be regarded as an area of the second electrode ELT2. However, the present disclosure is not limited thereto. For example, in an embodiment, the second electrode ELT2 and the second connection electrode CNL2 may be electrically connected to each other via at least one contact hole or the like.

In an embodiment, the second electrode ELT2 and/or the second connection electrode CNL2 may have a single-layer structure or a multi-layer structure. For example, the second electrode ELT2 and/or the second connection electrode CNL2 may be formed of a single reflective conductive layer. Alternatively, the second electrode ELT2 and/or the second connection electrode CNL2 may be formed of multiple layers including at least one reflective conductive layer, and at least one transparent conductive layer stacked on and/or under the reflective conductive layer.

In an embodiment, at least one conductive capping layer may be disposed over the second electrode ELT2 and/or the second connection electrode CNL2. In an embodiment, the conductive capping layer may include a transparent conductive layer, but the present disclosure is not limited thereto.

In an embodiment, at least one light emitting diode LD may be connected between each first electrode ELT1 and the corresponding second electrode ELT2. For example, at least one first light emitting diode LD1, e.g., a plurality of first light emitting diodes LD1, may be connected between the 11-th electrode ELT11 and the 21-st electrode ELT21. Likewise, at least one second light emitting diode LD2 e.g., a plurality of second light emitting diodes LD2, may be connected between the 12-th electrode ELT12 and the 22-nd electrode ELT22.

In an embodiment, the first electrode ELT1 and the second electrode ELT2 may be respectively directly connected to the first end EP1 and the second end EP2 of at least one light emitting diode LD, or may be respectively electrically connected to the first end EP1 end the second end EP2 of the light emitting diode LD via each at least one contact electrode. For example, the 11-th electrode ELT11 may be connected in common to the first ends EP1 of the first light emitting diodes LD1 through the 11-th contact electrode CNE11. The 21-st electrode ELT21 may be connected in common to the second ends EP2 of the first light emitting diodes LD1 through the 21-st contact electrode CNE21. Likewise, the 12-th electrode ELT12 may be connected in common to the first ends EP1 of the second light emitting diodes LD2 through the 12-th contact electrode CNE12. The 22-nd electrode ELT22 may be connected in common to the second ends EP2 of the second light emitting diodes LD2 through the 22-nd contact electrode CNE22.

In an embodiment, each light emitting diode LD may be a rod-type (rod-shaped) light emitting diode which is provided in an area in which a pair of first and second electrodes ELT1 and ELT2 corresponding to each other are disposed to face each other and may be oriented in the first direction DR1, e.g., in the horizontal direction, between the first and second electrodes ELT1 and ELT2. Although FIGS. 5 and 7 illustrate that the light emitting diodes LD are uniformly oriented in one direction, e.g., in the first direction DR1, the present disclosure is not limited thereto. For example, at least one of the light emitting diodes LD may be oriented in a diagonal direction between a pair of first and second electrodes ELT1 and ELT2.

In an embodiment, each of the light emitting diodes LD may be a light emitting diode which is made of a material having an inorganic crystal structure, and has a subminiature size, e.g. ranging from a nano scale to a micro scale. For example, each light emitting diode LD may be a subminiature rod-type (rod-shaped) light emitting diode which has a diameter D and/or a length L ranging from a nano scale to a micro scale, as illustrated in FIGS. 1A to 3B. However, the size of the light emitting diode LD may be changed in various suitable ways depending on design conditions, etc. of each pixel PXL including a light emitting device, e.g., a light source unit LSU that forms the light emitting device.

In an embodiment, the first ends EP1 of the light emitting diodes LD may be electrically connected to the corresponding first electrode ELT1 via the corresponding first contact electrode CNE1. The second ends EP2 of the light emitting diodes LD may be electrically connected to the corresponding second electrode ELT2 via the corresponding second contact electrode CNE2. For example, the first ends EP1 of the first light emitting diodes LD1 may be electrically connected to the 11-th electrode ELT11 via the 11-th contact electrode CNE11. The second ends EP2 of the first light emitting diodes LD1 may be electrically connected to the 21-st electrode ELT21 via the 21-st contact electrode CNE21. Likewise, the first ends EP1 of the second light emitting diodes LD2 may be electrically connected to the 12-th electrode ELT12 via the 12-th contact electrode CME12. The second ends EP2 of the second light emitting diodes LD2 may be electrically connected to the 22-nd electrode ELT22 via the 22-nd contact electrode CNE22. In an embodiment, at least one of the first and second ends EP1 and EP2 of each light emitting diode LD may come into direct contact with the corresponding first and/or second electrodes ELT1 and/or ELT2 and be electrically connected to the first and/or second electrodes ELT1 and/or ELT2.

In an embodiment, the light emitting diodes LD may be prepared in a diffused form in a predetermined solution, and then supplied by an inkjet printing scheme or the like to a predetermined (or set) emission area (e.g., the first and second emission areas EMA1 and EMA2 of each pixel PXL) defined in the light emitting device. For example, the light emitting diodes LD may be mixed with a volatile solvent and supplied to each emission area. Here, if the first power supply VDD and the second power supply VSS are respectively applied to the first and second electrodes ELT1 and ELT2 through the first and second power lines PL1 and PL2, an electric field is formed between the first and second electrodes ELT1 and ELT2, whereby the light emitting diodes LD are aligned between the first and second electrodes ELT1 and ELT2. After the light emitting diodes LD have been aligned, the solvent may be removed by a volatilization scheme or other suitable schemes. In this way, the light emitting diodes LD may be reliably arranged between the first and second electrodes ELT1 and ELT2 Furthermore, the first contact electrode CNE1 and the second contact electrode CNE2 may be respectively formed on the opposite ends, i.e., the first and second ends EP1 and EP2, of the light emitting diodes LD. Consequently, the light emitting diodes LD may be more reliably connected between the first and second electrodes ELT1 and ELT2.

In an embodiment, each first contact electrode CNE1 may be formed to cover the first ends EP1 of the light emitting diodes LD and at least a portion of the corresponding first electrode ELT1, whereby the first ends EP1 of the light emitting diodes LD may be physically and/or electrically connected to the first electrode ELT1. For example, the 11-th contact electrode CNE11 may be formed to cover the first ends EP1 of the first light emitting diodes LD1 and at least a portion of the 11-th electrode ELT11, whereby the first ends EP1 of the first light emitting diodes LD1 may be physically and/or electrically connected to the 11-th electrode ELT11. Likewise, the 12-th contact electrode CNE12 may be formed to cover the first ends EP1 of the second light emitting diodes LD2 and at least a portion of the 12-th electrode ELT12, whereby the first ends EP1 of the second light emitting diodes LD2 may be physically and/or electrically connected to the 12-th electrode ELT12.

In an embodiment, each second contact electrode CNE2 may be formed to cover the second ends EP2 of the light emitting diodes LD and at least a portion of the corresponding second electrode ELT2, whereby the second ends EP2 of the light emitting diodes LD may be physically and/or electrically connected to the second electrode ELT2. For example, the 21-st contact electrode CNE21 may be formed to cover the second ends EP2 of the first light emitting diodes LD1 and at least a portion of the 21-st electrode ELT21, whereby the second ends EP2 of the first light emitting diodes LD1 may be physically and/or electrically connected to the 21-st electrode ELT21. Likewise, the 22-nd contact electrode CNE22 may be formed to cover the second ends EP2 of the second light emitting diodes LD2 and at least a portion of the 22-nd electrode ELT22, whereby the second ends EP2 of the second light emitting diodes LD2 may be physically and/or electrically connected to the 22-nd electrode ELT22.

When the first power supply VDD (or a predetermined (or set) first control signal such as a scan signal or a data signal) is applied to the first ends EP1 of the light emitting diodes LD via the first power line PL1 and the first electrode ELT1, and the second power supply VSS (or a predetermined (or set) second control signal such as a scan signal or a data signal) is applied to the second ends EP2 of the light emitting diodes LD via the second power line PL2 and the second electrode ELT2, at least one light emitting diode LD that is connected in the forward direction between the first and second electrodes ELT1 and ELT2 may emit light. Thereby, the pixel PXL may emit light.

In an embodiment of the present disclosure, each of the first and second partition walls PW1 and PW2 may have a different structure for each emission area EMA. For example, a pair of first and second partition walls PW1 and PW2 disposed in the first emission area EMA1, i.e., the 11-th and 21-st partition walls PW11 and PW21, may have a structure different from that of a pair of first and second partition walls PW1 and PW2 disposed in the second emission area EMA2, i.e., the 12-th and 22-nd partition walls PW12 and PW22. In the descriptions of embodiments of the present disclosure, the words "the structure of the first and second partition walls PW1 and PW2" may collectively refer not only to the shape, configuration, and/or size of each of the first and second partition walls PW1 and PW2 but also to a mutual disposition relationship of the first and second partition walls PW1 and PW2, e.g., a distance therebetween.

For example, the first and second partition walls PW1 and PW2 corresponding to each other may be disposed at positions spaced apart from each other by a different distance for each emission area EMA. For example, in the first emission area EMA1, the 11-th partition wall PW11 and the 21-st partition wall PW21 may be disposed at positions spaced apart from each other by a first distance d1. In the second emission area EMA2, the 12-th partition wall PW12 and the 22-nd partition wall PW22 may be disposed at positions spaced apart from each other by a second distance d2 greater than the first distance d1. In the descriptions of embodiments of the present disclosure, the terms "first distance d1" and "second distance d2" may be used to describe a relative size of the distance or pitch in each embodiment, and may not specify a specific numerical range or the like. For example, the first distances d1 defined in this embodiment and other embodiments to be described later may have the same value or different values. Likewise, the second distances d2 defined in this embodiment and other embodiments to be described below may have the same value or different values in other words, the terms "first distance d1" and "second distance d2" may be terms used to define a relative distance or pitch between specific components in each embodiment.

According to the foregoing embodiment, the aspects of light emitted from the first emission area EMA1 and light emitted from the second emission area EMA2 may be diversified. The view angle range of the light emitting device including the first and second emission areas EMA1 and EMA2, and of the pixel PXL including the light emitting device may expand. The view angle expansion effect according to an embodiment of the present disclosure will be described in more detail below herein.

Figure 8A:
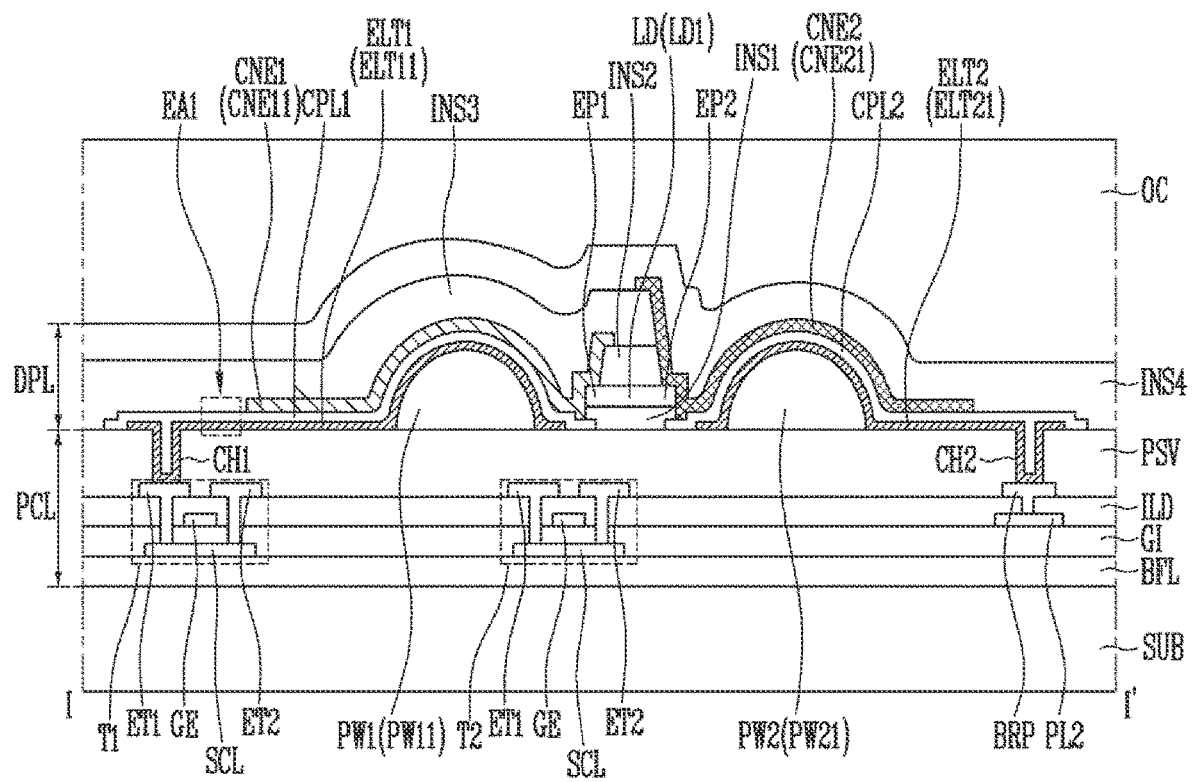
FIG. 8A is a sectional view illustrating a cross-section taken along line I-I' of FIG. 7.
Figure 8B:
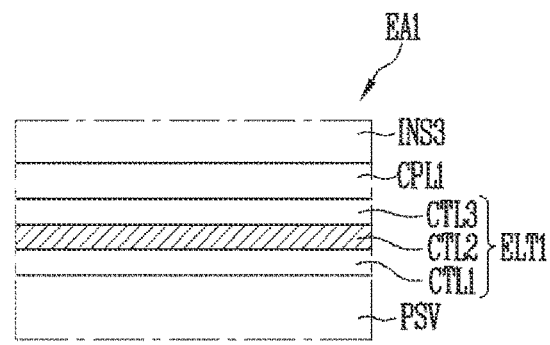
FIG. 8B is a sectional view illustrating an enlargement of area EA1 of FIG. 8A.

FIG. 8A is a sectional view illustrating an example of a cross-section taken along line I-I' of FIG. 7. FIG. 8B is a sectional view illustrating an enlargement of area EA1 of FIG. 8A In an embodiment, FIGS. 8A and 8B illustrate a cross-section of the light emitting device, centered on any one first light emitting diode LD1 disposed in the first emission area EMA1. In an embodiment, the first and second emission areas EMA1 and EMA2 may have similar cross-sections. For example, the first and second emission areas EMA1 and EMA2 may have substantially the same cross-sectional structure, other than the fact that they differ from each other in distance between the first and second partition walls PW1 and PW2. Therefore, for convenience of explanation, with reference to FIGS. 8A and 8B, the cross-sectional structure of each pixel PXL will be collectively described with the cross-section of the first emission area EMA1 corresponding to line I-I' of FIG. 7.

Referring to FIGS. 8A and 8B along with FIGS. 1A to 7, a pixel circuit layer PCL and a display element layer DPL may be successively placed in the display area DA on the substrate SUB. For example, the pixel circuit layer PCL may be formed on a surface of the substrate SUB, and the display element layer DPL may be formed over (or on) the surface of the substrate SUB on which the pixel circuit layer PCL has been formed.

In an embodiment, the pixel circuit layer PCL may include the respective pixel circuit PXC of the pixels PXL and/or lines connected thereto. The display element layer DPL may include the respective light source units LSU of the pixels PXL For example, the pixel circuit layer PCL may include a plurality of circuit elements, e.g., the first and second transistors T1 and T2 illustrated in FIGS. 5A and 5B, which form the pixel circuit PXC of each pixel PXL. Although not illustrated in FIG. 8A, the pixel circuit layer PCL may further include a storage capacitor Cst disposed in each pixel area, various signal lines (e.g., the scan line Si and the data line Dj illustrated in FIGS. 5A and 5B) connected to each pixel circuit PXC, and various power lines (e.g., the first power line PL1 and the second power line PL2) connected to the pixel circuit PXC and/or the light emitting diodes LD.

In an embodiment, a plurality of transistors, e.g., first and second transistors T1 and T2, provided in each pixel circuit PXC may have substantially identical or similar cross-sectional structure. However, the present disclosure is not limited thereto. In an embodiment, at least some of the plurality of transistors may have different types (kinds) and/or structures.

In addition, the pixel circuit layer PCL may include a plurality of insulating layers. For example, the pixel circuit layer PCL may include a buffer layer BFL, a gate insulating layer GI, an interlayer insulating layer ILD, and a passivation layer PSV which are successively stacked on one surface of the substrate SUB.

In an embodiment, the buffer layer BFL may prevent or reduce impurities from diffusing Into each circuit element. The buffer layer BFL may be formed of a single layer, or may be formed of multiple layers having at least two layers. In the case where the buffer layer BFL has a multi-layer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIG. 8A illustrates an embodiment in which each of the first and second transistors T1 and T2 includes the first transistor electrode ET1 and the second transistor electrode ET2 that are formed separately from the semiconductor layer SCL, the present disclosure is not limited thereto. For example, in an embodiment, the first and/or second transistor electrode ET1 and/or ET2 provided in at least one transistor disposed in each pixel area may be integrally formed with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first area which comes into contact with the first transistor electrode ET1, a second area which comes into contact with the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel region of the semiconductor layer SCL may be an intrinsic semiconductor, which is an undoped semiconductor pattern. Each of the first and second areas of the semiconductor layer SCL may be a semiconductor pattern doped with a predetermined (or set) impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and may overlap at least a portion of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first area and the second area of the semiconductor layer SCL through corresponding contact holes which pass through the gate insulating layer GI and the interlayer insulating layer ILD.

In an embodiment, any one of the first and second transistor electrodes ET1 and ET2 of at least one transistor (e.g., the first transistor T1 of FIGS. 5A and 5B) provided in the pixel circuit PXC may be electrically connected, through the first contact hole CH1 passing through the passivation layer PSV, to the first electrode ELT1 of the light source unit LSU disposed on the passivation layer PSV.

In an embodiment, at least one signal line and/or power line that is connected to each sub-pixel SPX may be disposed on the same layer as that of one electrode of each of the circuit elements that form the pixel circuit PXC. For example, the second power line PL2 for supplying the second power supply VSS may be disposed on the same layer as that of the gale electrodes GE of the first and second transistors T1 and T2, and may be electrically connected to the second electrode ELT2 of the light source unit LSU that is disposed on the passivation layer PSV, both through a bridge pattern BRP disposed on the same layer as that of the first and second transistor electrodes ET1 and ET2 and through at least one second contact hole CH2 passing through the passivation layer PSV. However, the structures and/or positions of the second power line PL2, etc. may be changed in various suitable ways.

In an embodiment, the display element layer DPL may include a plurality of light emitting diodes LD disposed over the pixel circuit layer PCL in each pixel area. For example, the display element layer DPL may include at least one first light emitting diode LD1 disposed in the first emission area EMA1 of each pixel PXL, and at least one second light emitting diode LD2 disposed in the second emission area EMA2 of each pixel PXL. Furthermore, the display element layer DPL may further include at least one insulating layer and/or insulating pattern disposed around the light emitting diodes LD.

For example, the display element layer DPL may include the first and second electrodes ELT1 and ELT2 disposed in each pixel area, the light emitting diodes LD disposed between the first and second electrodes ELT1 and ELT2 corresponding to each other and the first and second contact electrodes CNE1 and CNE2 respectively disposed on first and second ends EP1 and EP2 of the light emitting diodes LD. In addition, the display element layer DPL may further include, e.g., at least one conductive layer and/or at least one insulating layer (or insulating pattern). For example, the display element layer DPL may further include at least one of the first and second partition walls PW1 and PW2 and the first to fourth insulating layers INS1, INS2, INS3, and INS4.

In an embodiment, the first and second partition walls PW1 and PW2 may be disposed on the pixel circuit layer PCL. For example, at least one pair of first and second partition walls PW1 and PW2 may be disposed in the emission area EMA of each pixel area.

In an embodiment, each of the first and second partition walls PW1 and PW2 may include insulating material having inorganic material or organic material. Furthermore, each of the first and second partition walls PW1 and PW2 may have a single-layer structure or a multi-layer structure. In other words, the material and/or the stacked structure of each of the first and second partition walls PW1 and PW2 may be changed in various suitable ways rather than being particularly limited.

In an embodiment, each of the first and second partition walls PW1 and PW2 may have various suitable shapes. For example, as illustrated in FIG. 8A, each of the first and second partition walls PW1 and PW2 may have a semicircular or semi-elliptical cross-section the width of which is gradually reduced upward. In this case, each of the first and second partition walls PW1 and PW2 may have a curved surface on at least one side. However, the present disclosure is not limited thereto. For example, each of the first and second partition walls PW1 and PW2 may have a trapezoidal cross-section the width of which is gradually reduced upward. In this case, each of the first and second partition walls PW1 and PW2 may have an inclined surface on at least one side. In other words, the shape of each of the first and second partition walls PW1 and PW2 may be changed in various suitable ways rather than being particularly limited.

In an embodiment, the first and second electrodes ELT1 and ELT2 and the first and second connection electrodes CNL1 and CNL2 may be disposed in each pixel area provided with the first and second partition walls PW1 and PW2.

In an embodiment the first and second electrodes ELT1 and ELT2 may be disposed at positions spaced apart from each other by a predetermined or set distance on the substrate SUB on which the pixel circuit layer PCL and/or the first and second partition walls PW1 and PW2 have been formed. The first and second connection electrodes CNL1 and CNL2 may be respectively integrally connected with the first and second electrodes ELT1 and ELT2.

In an embodiment, the first electrodes ELT1 may be respectively disposed on the first partition walls PW1, and the second electrodes ELT2 may be respectively disposed on the second partition walls PW2. In an embodiment, any one of the first and second electrodes ELT1 and ELT2 may be an anode electrode, and the other may be a cathode electrode.

The first and second electrodes ELT1 and ELT2 may have shapes corresponding to those of the first and second partition walls PW1 and PW2, respectively. For example, each first electrode ELT1 may be protruded in a height direction of the substrate SUB by the corresponding first partition wall PW1 and have a curved or inclined surface corresponding to the cross-section of the first partition wall PW1. For example, each first electrode ELT1 may be protruded in the height direction of the substrate SUB by the first partition wall PW1 provided under the first electrode ELT1 and have a curved or inclined surface facing the first end EP1 of the adjacent tight emitting diode LD. Likewise, each second electrode ELT2 may be protruded in the height direction of the substrate SUB by the corresponding second partition wall PW2 and have a curved or inclined surface corresponding to the cross-section of the second partition wall PW2. For example, each second electrode ELT2 may be protruded in the height direction of the substrate SUB by the second partition wall PW2 provided under the second electrode ELT2 and have a curved or inclined surface facing the second end EP2 of the adjacent light emitting diode LD.

In an embodiment, each of the first and second electrodes ELT1 and ELT2 may include at least one conductive material. For example, each of the first and second electrodes ELT1 and ELT2 may include at least one of metal such as Ag, Mg, Al, Pt, Pd, Au, Ni, Nd, Ir, Cr, Ti or an alloy thereof, conductive oxide such as ITO, IZO, ZnO, or ITZO, and a conductive polymer such as PEDOT; however, it is not limited thereto.

In an embodiment, each of the first and second electrodes ELT1 and ELT2 may have a single-layer or multi-layer structure. For example, as illustrated in FIG. 8B, each first electrode ELT1 may include at least one reflective electrode layer CTL2, and may further include a first transparent electrode layer CTL1 disposed under the reflective electrode layer CTL2, and/or a second transparent electrode layer CTL3 disposed on the reflective electrode layer CTL2.

In an embodiment, the reflective electrode layer CTL2 may be formed of a conductive material having a predetermined or set reflectivity. For example, the reflective electrode layer CTL2 may include at least one of metals such as Ag, Mg, Al, Pt, Pd, Au, Ni, Nd, Ir, Cr, and an alloy thereof, however, the present disclosure is not limited thereto. In other words, the reflective electrode layer CTL2 may be formed of various suitable reflective conductive materials. In an embodiment, the first and second transparent electrode layers CTL1 and CTL3 may be formed of various suitable transparent electrode materials. For example, the first and second transparent electrode layers CTL1 and CTL3 may include ITO, IZO, or ITZO; however, the present disclosure is not limited thereto.

Likewise each second electrode ELT2 may include at least one reflective electrode layer, and may further include at least one transparent layer disposed under and/or on the reflective electrode layer. In an embodiment, the first and second electrodes ELT1 and ELT2 may have substantially the same cross-sectional structure, but the present disclosure is not limited thereto. In other words, the first and second electrodes ELT1 and ELT2 may have identical or different single-layer or multi-layer structures.

In an embodiment, each of the first and second electrodes ELT1 and ELT2 may have a three-layer structure having a stacked structure of ITO/Ag/ITO. Each of the first and second connection electrodes CNL1 and CNL2 connected to the first and second electrodes ELT1 and ELT2 may have a multi-layer structure in the same manner as that of the first and second electrodes ELT1 and ELT2. As such, if each of the first and second electrodes ELT1 and ELT2 and/or each of the first and second connection electrodes CNL1 and CNL2 has a multi-layer structure with at least two layers, a voltage drop due to a signal delay may be minimized or reduced.

Furthermore, if each of the first and second electrodes ELT1 and ELT2 includes at least one reflective electrode layer (e.g., CTL2), light emitted from the opposite ends of each light emitting diode LD, e.g., the first and second ends EP1 and EP2 of the light emitting diode LD, may propagate in a direction (e.g., in a frontal direction of the display panel PNL) in which an image is displayed. For example, if the first and second electrodes ELT1 and ELT2 respectively have curved or inclined surfaces corresponding to the shapes of the first and second partition walls PW1 and PW2 and are respectively disposed to face the first and second ends EP1 and EP2 of the light emitting diodes LD, light emitted from the first and second ends EP1 and EP2 of each light emitting diodes LD may be reflected by the first and second electrodes ELT1 and ELT2 and thus further reliably propagate in the frontal direction of the display panel PNL (e.g., in an upward direction of the substrate SUB). Thereby, the efficiency of light emitted from the light emitting diodes LD may be enhanced.

In an embodiment of the present disclosure, each of the first and second partition walls PW1 and PW2 may also function as a reflective member. For example, the first and second partition walls PW1 and PW2, along with the first and second electrodes ELT1 and ELT2 provided on the first and second partition walls PW1 and PW2, may function as reflective members for enhancing the efficiency of light emitted from each light emitting diode LD.

In an embodiment, the first and second partition walls PW1 and PW2 may have the same height, so that the first and second electrodes ELT1 and ELT2 may have the same height. When the first and second electrodes ELT1 and ELT2 have the same height the light emitting diodes LD may be more reliably connected between the first and second electrodes ELT1 and ELT2. However, the present disclosure is not limited to this. For example, the shapes, structures, heights and/or the mutual disposition relationship of the first and second electrodes ELT1 and ELT2 may be changed in various suitable ways.

At least one conductive capping layer may be selectively disposed on each of the first and second electrodes ELT1 and ELT2. For example, a first conductive capping layer CPL1 may be formed on each first electrode ELT1 to cover the first electrode ELT1. A second conductive capping layer CPL2 may be formed on each second electrode ELT2 to cover the second electrode ELT2.

Each of the first and second conductive capping layers CPL1 and CPL2 may be formed of transparent conductive material such as ITO or IZO so as to minimize or reduce the loss of light emitted from the light emitting diodes LD. However, the present disclosure is not limited thereto. For example, the material of the first and second conductive capping layers CPL1 and CPL2 may be changed in various suitable ways.

The first and second conductive capping layer CPL1 and CPL2 may prevent or reduce the first and second electrodes ELT1 and ELT2 from being damaged due to a failure or the like which may occur during a process of manufacturing the display panel PNL. Furthermore, the first and second conductive capping layers CPL1 and CPL2 may enhance adhesive force between the substrate SUB provided with the pixel circuit layer PCL etc. and the first and second electrodes ELT1 and ELT2. In an embodiment, at least one of the first and second conductive capping layers CPL1 and CPL2 may be omitted.

In an embodiment, a first insulating layer INS1 may be disposed in each emission area EMA in which at least one pair of first and second electrodes ELT1 and ELT2 are disposed. In an embodiment, the first insulating layer INS1 may be disposed between the pixel circuit layer PCL and the light emitting diodes LD. The first insulating layer INS1 may function to stably (or suitably) support the light emitting diodes LD and prevent or reduce the risk of the light emitting diodes LD being displaced from correct (or desired) positions thereof. In an embodiment, the first insulating layer INS1 may be formed in an independent pattern in each emission area EMA; however, the present disclosure is not limited thereto.

In an embodiment, at least one light emitting diode LD may be provided and aligned in each emission area EMA in which the first insulating layer INS1 is disposed. For example, a plurality of light emitting diodes LD may be provided and aligned in each emission area EMA.

In an embodiment, the light emitting diodes LD may be self-aligned by an electric field formed between the first and second electrodes ELT1 and ELT2 when predetermined (or set) voltages are applied to the first and second electrodes ELT1 and ELT2. Thereby, the light emitting diodes LD may be disposed between the first and second electrodes ELT1 and ELT2.

The shape and/or structure of each light emitting diode LD is not limited to the embodiments illustrated in FIG. 8A, for example. For example, each light emitting diode LD may have various suitable shapes, cross-sectional structures and/or connection structures.

In an embodiment, a second insulating layer INS2 covering portions of respective upper surfaces of the light emitting diodes LD may be disposed in each emission area EMA provided with the light emitting diodes LD. In an embodiment, the second insulating layer INS2 may be selectively disposed on only upper portions of the light emitting diodes LD without covering at least the opposite ends, i.e., the first and second ends EP1 and EP2, of the light emitting diodes LD. The second insulating layer INS2 may be formed in an Independent pattern in each emission area EMA; however, the present disclosure is not limited thereto.

In an embodiment, the first contact electrode CNE1 may be disposed in each emission area EMA provided with the second insulating layer INS2. In an embodiment, the first contact electrode CNE1 may be disposed on the first electrode ELT1 disposed in the corresponding emission area EMA so that the first contact electrode CNE1 comes into contact with a portion of the first electrode ELT1. Furthermore, the first contact electrode CNE1 may be disposed on the first end EP1 of at least one light emitting diode LD disposed in the corresponding emission area EMA so that the first contact electrode CNE1 comes into contact with the first end EP1. Due to the first contact electrode CNE1, the first end EP1 of at least one light emitting diode LD disposed in each emission area EMA may be electrically connected to the first electrode ELT1 disposed in the corresponding emission area EMA.

In an embodiment, a third insulating layer INS3 may be disposed in each emission area EMA provided with the first contact electrode CNE1. In an embodiment, the third insulating layer INS3 may be formed to cover the second insulating layer INS2 and the first contact electrode CNE1 that are disposed in the corresponding emission area EMA.

In an embodiment, the second contact electrode CNE2 may be disposed in each emission area EMA provided with the third insulating layer INS3. In an embodiment, the second contact electrode CNE2 may be disposed on the second electrode ELT2 disposed in the corresponding emission area EMA so that the second contact electrode CNE2 comes into contact with a portion of the second electrode ELT2. Furthermore, the second contact electrode CNE2 may be disposed on the second end EP2 of at least one light emitting diode LD disposed in the corresponding emission area EMA so that the second contact electrode CNE2 comes into contact with the second end EP2. Due to the second contact electrode CNE2, the second end EP2 of at least one light emitting diode LD disposed in each emission area EMA may be electrically connected to the second electrode ELT2 disposed in the corresponding emission area EMA.

In an embodiment, a fourth insulating layer INS4 may be disposed in each emission area EMA provided with the second contact electrode CNE2. In an embodiment, the fourth insulating layer INS4 may be formed to cover the first and second electrodes ELT1 and ELT2, the light emitting diodes LD, and the first and second contact electrodes CNE1 and CNE2 that are disposed in the corresponding emission area EMA.

In an embodiment, each of the first to fourth insulating layers INS1 and INS4 may have a single-layer or multi-layer structure, and may include at least one inorganic insulating material and/or organic insulating material. For example, each of the first to fourth insulating layers INS1 to INS4 may include various suitable organic/inorganic insulating materials including $SiN_x$, but the material of each of the first to fourth insulating layers INS1 to INS4 is not particularly limited. The first to fourth insulating layers INS1 to INS4 may respectively include different insulating materials, or at least some of the first to fourth insulating layers INS1 to INS4 may include the same insulating material.

In an embodiment, an overcoat layer OC may be disposed on the substrate SUB on which the first and second electrodes ELT1 and ELT2, the light emitting diodes LD, the first and second contact electrodes CNE1 and CNE2, and the first to fourth insulating layers INS1 to INS4 have been disposed. For example, the overcoat layer OC may be formed in the entirety of the display area DA to cover the upper surface of the substrate SUB on which the first and second electrodes ELT1 and ELT2, the light emitting diodes LD, and the first and second contact electrodes CNE1 and CNE2 have been disposed. In an embodiment the overcoat layer OC may include at least one Inorganic layer and/or organic layer for protecting components of the display element layer DPL, and may also include various functional layers, etc.

FIG. 9 is a sectional view illustrating a change in view angle depending on a distance between the light emitting diode LD and the first and second partition walls PW1 and PW2. Hereinafter, a method of improving (expanding) a view angle of a light emitting device and a pixel PXL including the light emitting device in accordance with an embodiment of the present disclosure will be described with reference to FIG. 9 along with FIGS. 6 to 8B. To clarify a relationship between a propagation direction of light and a change in distance between the light emitting diode LD and the first and second partition walls PW1 and PW2, a refraction effect or the like is not be reflected (shown) in FIG. 9.

Referring to FIGS. 6 to 9, as the distance between each first partition wall PW1 and the first end EP1 of the light emitting diode LD is reduced, the direction in which light emitted from the first end EP1 propagates is oriented upward. For example, when, based on a predetermined (or set) point at which a light ray emitted from the first end EP1 of the light emitting diode LD reaches the 11-th electrode ELT11 on the 11-th partition wall PW11, the distance between the 11-th electrode ELT11 and the first end EP1 facing the 11-th electrode ELT11 is approximately a1 and a difference in height between the 11-th electrode ELT11 and the first end EP1 facing the 11-th electrode ELT11 is approximately b1, a view angle θ1 of the corresponding light ray is a value corresponding to approximately arctan (a1/b1). For example, when, based on a predetermined for set) point at which a light ray emitted from the first end EP1 of the light emitting diode ID reaches the 12-th electrode ELT12 on the 12-th partition wall PW12, the distance between the 12-th electrode ELT12 and the first end EP1 facing the 12-th electrode ELT12 is approximately a2 and a difference in height between the 12-th electrode ELT12 and the first end EP1 facing the 12-th electrode ELT12 is approximately b2, a view angle θ2 of the corresponding light ray is a value corresponding to approximately arctan (a2/b2).

In the present embodiments, depending on the distance between the first end EP1 of the light emitting diode LD and the first partition wall PW1 facing the first end EP1, the range of the view angle of light emitted from the first end EP1 may vary. Likewise, depending on the distance between the second end EP2 of the light emitting diode LD and the second partition wall PW2 facing the second end EP2, the range of the view angle of light emitted from the second end EP2 may vary.

If, in the same manner as the embodiments illustrated in FIGS. 6 and 7, the emission area EMA of each pixel PXL is divided into a plurality of emission areas, e.g., the first and second emission areas EMA1 and EMA2, and the first and second partition walls PW1 and PW2 are disposed at positions spaced apart from each other by a different distance for each emission area EMA, the profile of light emitted from the first emission area EMA1 and the profile of light emitted from the second emission area EMA2 may have different aspects.

For example, in the first emission area EMA1, the 11-th and 21-st partition walls PW11 and PW21 may be disposed at the first distance d1 (corresponding to a value obtained by, for example, adding 2 μm to the length of the first light emitting diode LD1) from each other so that the distance between the first end EP1 of the first light emitting diode LD1 and the 11-th partition wall PW11 and the distance between the second end EP2 of the first light emitting diode LD1 and the 21-st partition wall PW21 each may be 1 μm. Furthermore, in the second emission area EMA2, the 12-th and 22-nd partition walls PW12 and PW22 may be disposed at the second distance d2 (corresponding to a value obtained by, for example, adding 4 μm to the length of the second light emitting diode LD2) from each other so that the distance between the first end EP1 of the second light emitting diode LD2 and the 12-th partition wall PW12 and the distance between the second end EP2 of the second light emitting diode LD2 and the 22-nd partition wall PW22 each may be 2 μm. In this case, light emitted from the first light emitting diode LD1, particularly, from the opposite ends of the first light emitting diode LD1, may be emitted within a view angle range comparatively close to the frontal direction (e.g., a third direction DR3 that is the height direction) of the display panel PNL, and light emitted from the second light emitting diode LD2, particularly, from the opposite ends of the second light emitting diode LD2, may be emitted within a view angle comparatively close to a lateral direction of the display panel PNL.

Therefore, according to the foregoing embodiment, light emitted from each light emitting device and the pixel PXL including the light emitting device may be dispersed and emitted within a relatively wide view angle range. In addition, the profile of light emitted from each emission area EMA may be controlled to correspond to a desired view angle range by adjusting the distances between each light emitting diode LD and the first and second partition walls PW1 and PW2 adjacent to the light emitting diode LD or the distance between each pair of first and second partition walls PW1 and PW2.

Figure 10:
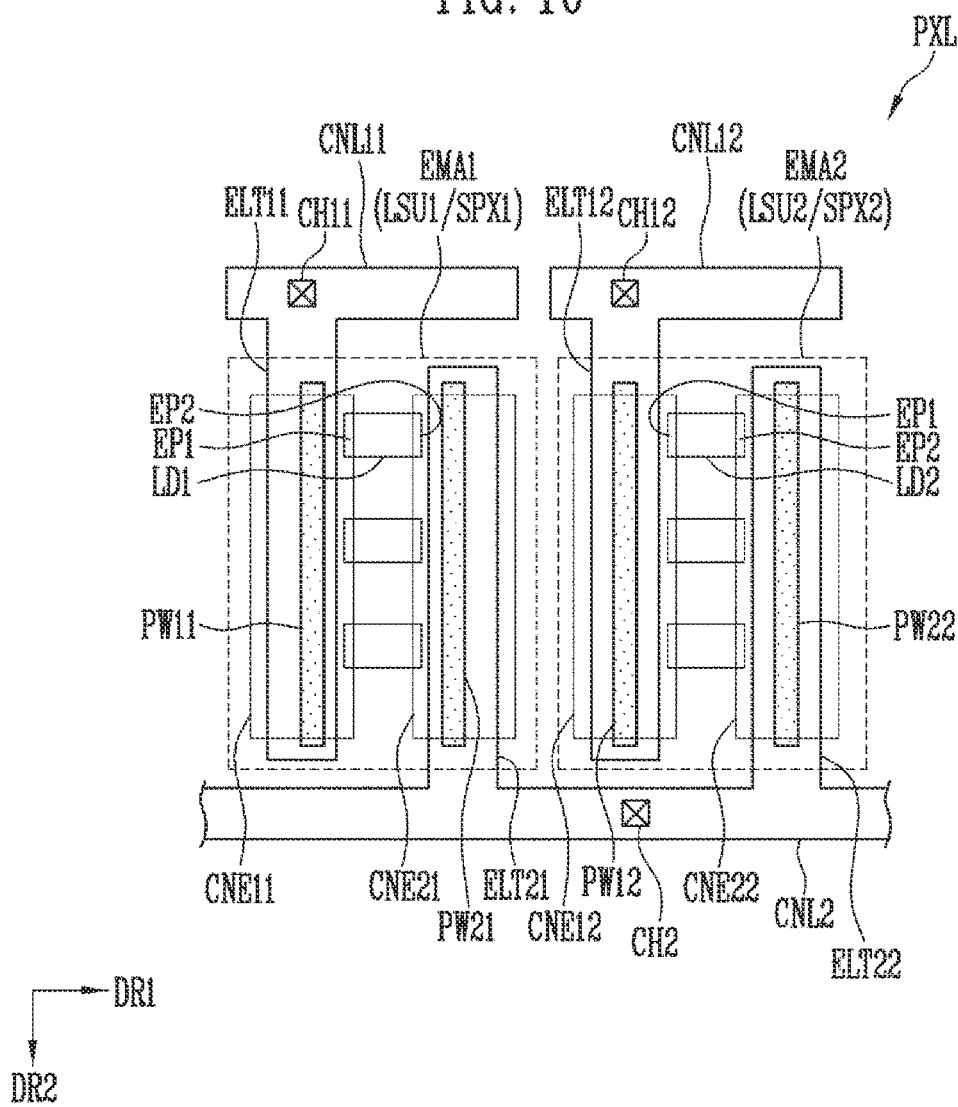
FIG. 10 is a plan view illustrating an example of a pixel including a light emitting device in accordance with an embodiment of the present disclosure.

FIG. 10 is a plan view illustrating an example of a pixel PXL including a light emitting device in accordance with an embodiment of the present disclosure. In an embodiment of FIG. 10, like reference numerals are used to designate identical or similar components as those of the embodiments of FIGS. 6 to 9, and duplicative descriptions thereof will not be provided.

Referring to FIG. 10, the first electrode ELT1 may be separately formed for each emission area EMA. For example, the 11-th electrode ELT11 of the first emission area EMA1 and the 11-th connection electrode CNL11 connected to the 11-th electrode ELT11 may be separated from the 12-th electrode ELT12 of the second emission area EMA2 and the 12-th connection electrode CNL12 connected to the 12-th electrode ELT12. In this case, for each emission area EMA, the corresponding first electrode ELT1 may be individually driven. Consequently, each emission area EMA may form a light source unit LSU which may be individually and/or independently controlled.

In an embodiment, each pixel PXL may include first and second light source units LSU1 and LSU2 which may individually control emission by the first and second emission control transistors ECT1 and ECT2, as illustrated in FIG. 5D. In an embodiment, the 11-th electrode ELT11 and the 11-th connection electrode CNL11 may be electrically connected to the first emission control transistor ECU through the 11-th contact hole CH11. In this case, the first emission area EMA1 may form the first light source unit LSU1. Likewise, the 12-th electrode ELT12 and the 12-th connection electrode CNL12 may be electrically connected to the second emission control transistor ECT2 through the 12-th contact hole CH12. In this case, the second emission area EMA2 may form the second light source unit LSU2. According to the foregoing embodiment, emission of each of the first and second light source units LSU1 and LSU2 may be easily controlled, whereby the profile of light emitted from the pixel PXL may be easily adjusted to correspond to a desired view angle range.

In an embodiment, each pixel PXL may include first and second light source units LSU1 and LSU2 which may be individually driven by the first and second pixel circuits PXC1 and PXC2, as Illustrated in FIG. 5E. In an embodiment, the 11-th electrode ELT11 and the 11-th connection electrode CNL11 may be electrically connected to the first pixel circuit PXC1 through the 11-th contact hole CH11. In this case, the first emission area EMA1 may form the first light source unit LSU1 of the first sub-pixel SPX1. Likewise, the 12-th electrode ELT12 and the 12-th connection electrode CNL12 may be electrically connected to the second pixel circuit PXC2 through the 12-th contact hole CH12. In this case, the second emission area EMA2 may form the second light source unit LSU2 of the second sub-pixel SPX2. According to the foregoing embodiment emission and/or luminance of each of the first and second light source units LSU1 and LSU2 may be easily controlled, whereby the profile of light emitted from the pixel PXL may be more precisely adjusted to correspond to a desired view angle range.

Figure 11:
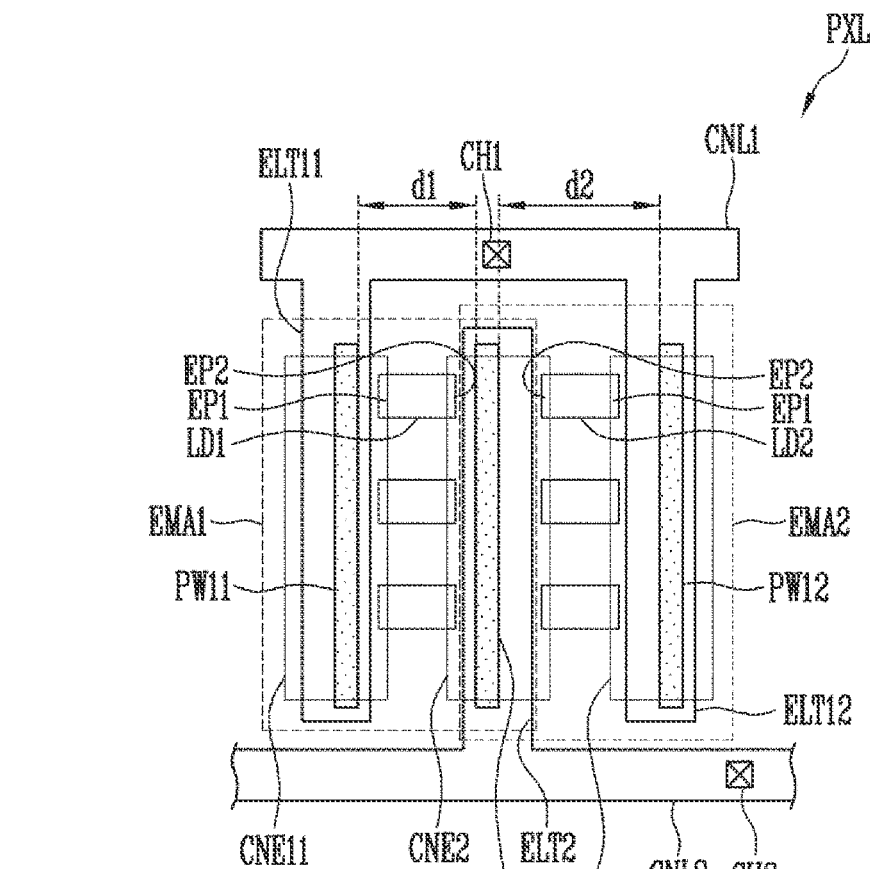
FIG. 11 is a plan view illustrating an example of a pixel including a light emitting device in accordance with an embodiment of the present disclosure.

FIG. 11 is a plan view illustrating a light emitting device in accordance with an embodiment of the present disclosure, for example, illustrating an example of a pixel PXL including the light emitting device. In an embodiment of FIG. 11, like reference numerals are used to designate identical or similar components as those of the embodiments of FIGS. 6 to 9, and duplicative descriptions thereof will not be provided.

Referring to FIG. 11, the first and second emission areas EMA1 and EMA2 may share at least one electrode and/or partition wall. For example, the first and second emission areas EMA1 and EMA2 may include an intersection area in which the first and second emission areas EMA1 and EMA2 overlap with each other. The first and second emission areas EMA1 and EMA2 may share a second partition wall PW2 (or also referred to as "second common partition wall") disposed in the intersection area, and a second electrode ELT2 (or also referred to as "second common electrode") and a second contact electrode CNE2 (or also referred to as "second common contact electrode") that are disposed over the second partition wall PW2.

In an embodiment, the second partition wall PW2 may make a pair with the 11-th partition wall PW11 in the first emission area EMA1 and may make a pair with the 12-th partition wall PW12 in the second emission area EMA2. Likewise, the second electrode ELT2 may make a pair with the 11-th electrode ELT11 in the first emission area EMA1 and may make a pair with the 12-th electrode ELT12 in the second emission area EMA2.

In the foregoing embodiment, the first and second partition walls PW1 and PW2 may also be spaced apart from each other by a different distance for each emission area EMA. For example, the 11-th partition wall PW11 and the second common partition wall PW2 may be spaced apart from each other by a first distance d1 in the first emission area EMA1, and the 12-th partition wall PW12 and the second common partition wall PW2 may be spaced apart from each other by a second distance d2 greater than the first distance d1 in the second emission area EMA2. Thereby, the view angle range of light emitted from each light emitting device or the pixel PXL including the light emitting device may expand.

FIGS. 12 to 16 each are a plan view illustrating different examples of a pixel PXL including a light emitting device in accordance with one or more embodiments of the present disclosure. In the description of the embodiments of FIGS. 12 to 16, like reference numerals will be used to designate components similar or equal to those of the previous embodiments, and duplicative explanations thereof will not be provided.

Figure 12:
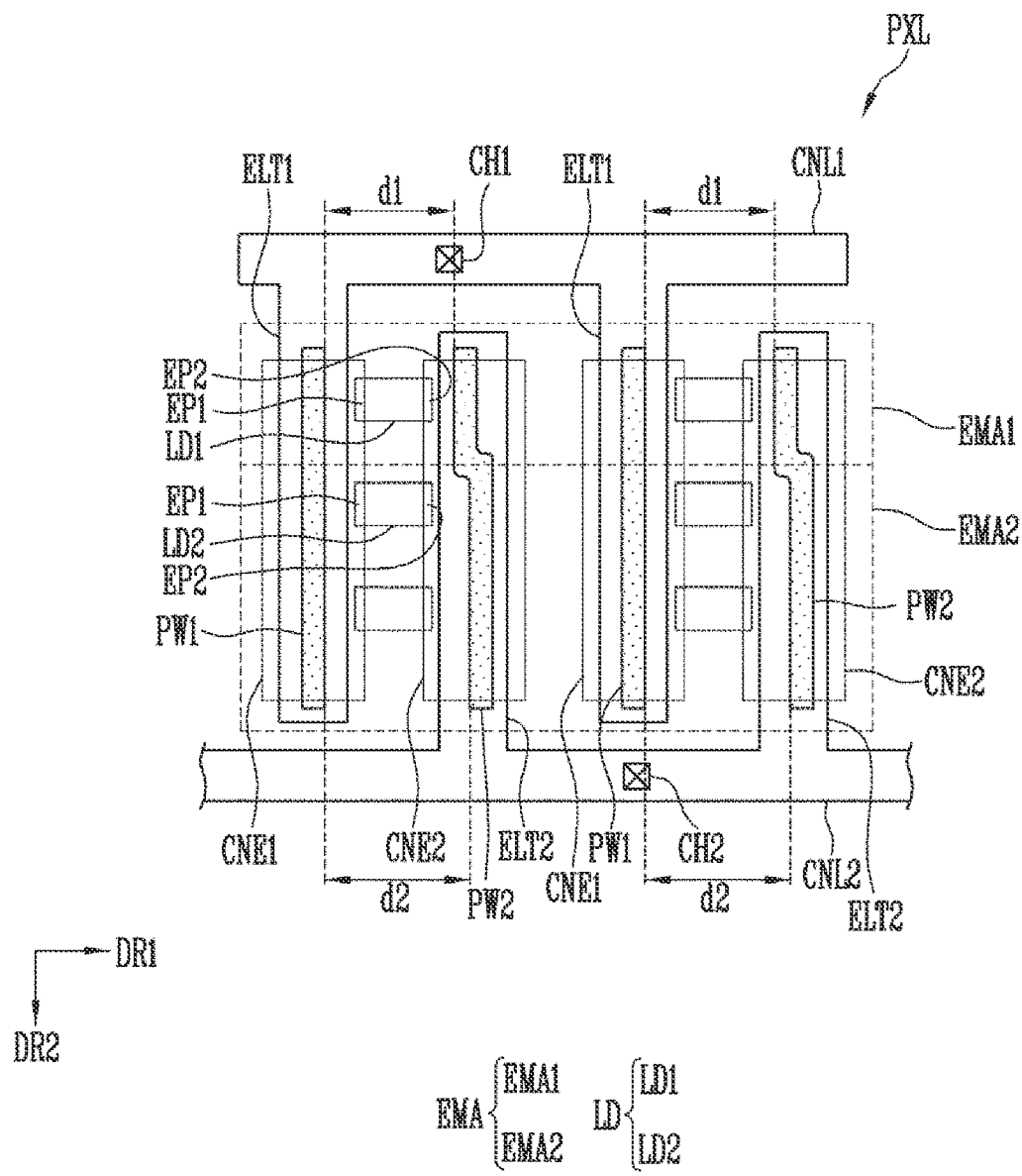
FIGS. 12 to 16 each are a plan view illustrating different examples of a pixel including a light emitting device in accordance with one or more embodiments of the present disclosure.
Figure 13:
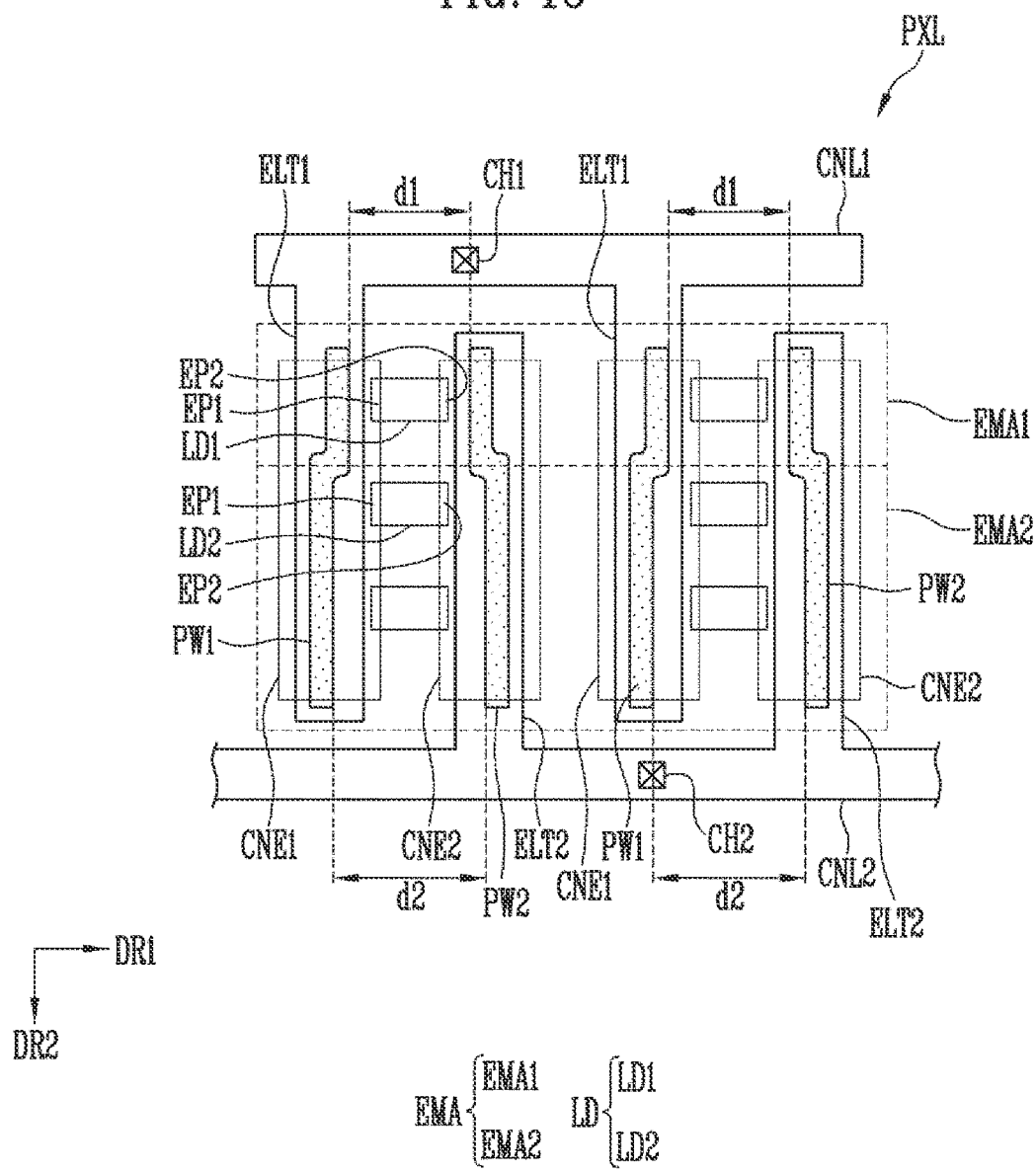

Referring to FIGS. 12 and 13, each pixel PXL may include a plurality of emission areas EMA, e.g., first and second emission areas EMA1 and EMA2, which are successively disposed in a second direction DR2. In an embodiment each of the first and second partition walls PW1 and PW2 may integrally extend in the first and second emission areas EMA1 and EMA2. For example, each first partition wall PW1 may extend in the second direction DR2 in the emission area EMA including the first and second emission areas EMA1 and EMA2 without being disconnected in a boundary between the first and second emission areas EMA1 and EMA2. Likewise, each second partition wall PW2 may extend in the second direction DR2 in the emission area EMA including the first and second emission areas EMA1 and EMA2 without being disconnected in a boundary between the first and second emission areas EMA1 and EMA2.

The first and second partition walls PW1 and PW2 may be spaced apart from each other by a different distance for each emission area EMA. For example, a pair of first and second partition walls PW1 and PW2 corresponding to each other may be spaced apart from each other by a first distance d1 in the first emission area EMA1 and may be spaced apart from each other by a second distance d2 greater than the first distance d1 in the second emission area EMA2.

In other words, in an embodiment, the first and second partition walls PW1 and PW2 may be spaced apart from each other by a different distance for each emission area (section) EMA with respect to the second direction DR2 To this end at least one of the first and second partition walls PW1 and PW2 that form each pair may have a bent part on the boundary between the first and second emission areas EMA1 and EMA2. For example, as illustrated in FIG. 12, each second partition wall PW2 may be bent at least once on the boundary between the first and second emission areas EMA1 and EMA2. Alternatively, as illustrated in FIG. 13, both the first partition wall PW1 and the second partition wall PW2 be bent at least once on the boundary between the first and second emission areas EMA1 and EMA2.

In an embodiment, at least one partition wall, e.g., each second partition wall PW2 or each of the first and second partition walls PW1 and PW2, having a bent part may have a structure which is bent in a curved shape on the boundary between the first and second emission areas EMA1 and EMA2. As such, if at least one partition wall having a bent part is bent to have a curved corner, an electric field may be prevented or reduced from being focused only on the bent part during a process of aligning the light emitting diodes LD, compared to that of a comparative example in which the at least one partition wall is angularly bent (e.g., at a right angle). Consequently, the light emitting diodes LD may be more reliably aligned between the first and second electrodes ELT1 and ELT2.

In an embodiment, a pair of first and second partition walls PW1 and PW2 that correspond to each other may form an asymmetrical structure in at least one emission area EMA. For example, as illustrated in the embodiment of FIG. 12, a pair of first and second partition walls PW1 and PW2 may have an asymmetrical structure. In an embodiment, if only one (e.g., the second partition wall PW2) of the pair of first and second partition walls PW1 and PW2 has a bent part, the distance between the first end EP1 of each light emitting diode LD and the first partition wall PW1 in at least some emission areas EMA may differ from the distance between the second end EP2 of each light emitting diode LD and the second partition wall PW2.

In an embodiment, a pair of first and second partition walls PW1 and PW2 that face each other may form a symmetrical structure in the entirety of the emission area EMA of the pixel PXL For example, as illustrated in the embodiment of FIG. 13, a pair of first and second partition walls PW1 and PW2 may have a symmetrical structure in each of the first and second emission areas EMA1 and EMA2. As such, in various embodiments, the shapes of the first and second partition walls PW1 and PW2, a mutual disposition relationship between the first partition walls PW1 and/or the second partition walls PW2 and so forth may be changed in various suitable ways.

In the embodiments of FIGS. 6 to 11, 12, and 13, the emission area EMA of each pixel PXL is divided along the first direction DR1 or the second direction DR2, but the present disclosure is not limited thereto. For example, in an embodiment, the emission area EMA of each pixel PXL may be divided along a plurality of directions intersecting with each other.

Figure 14:
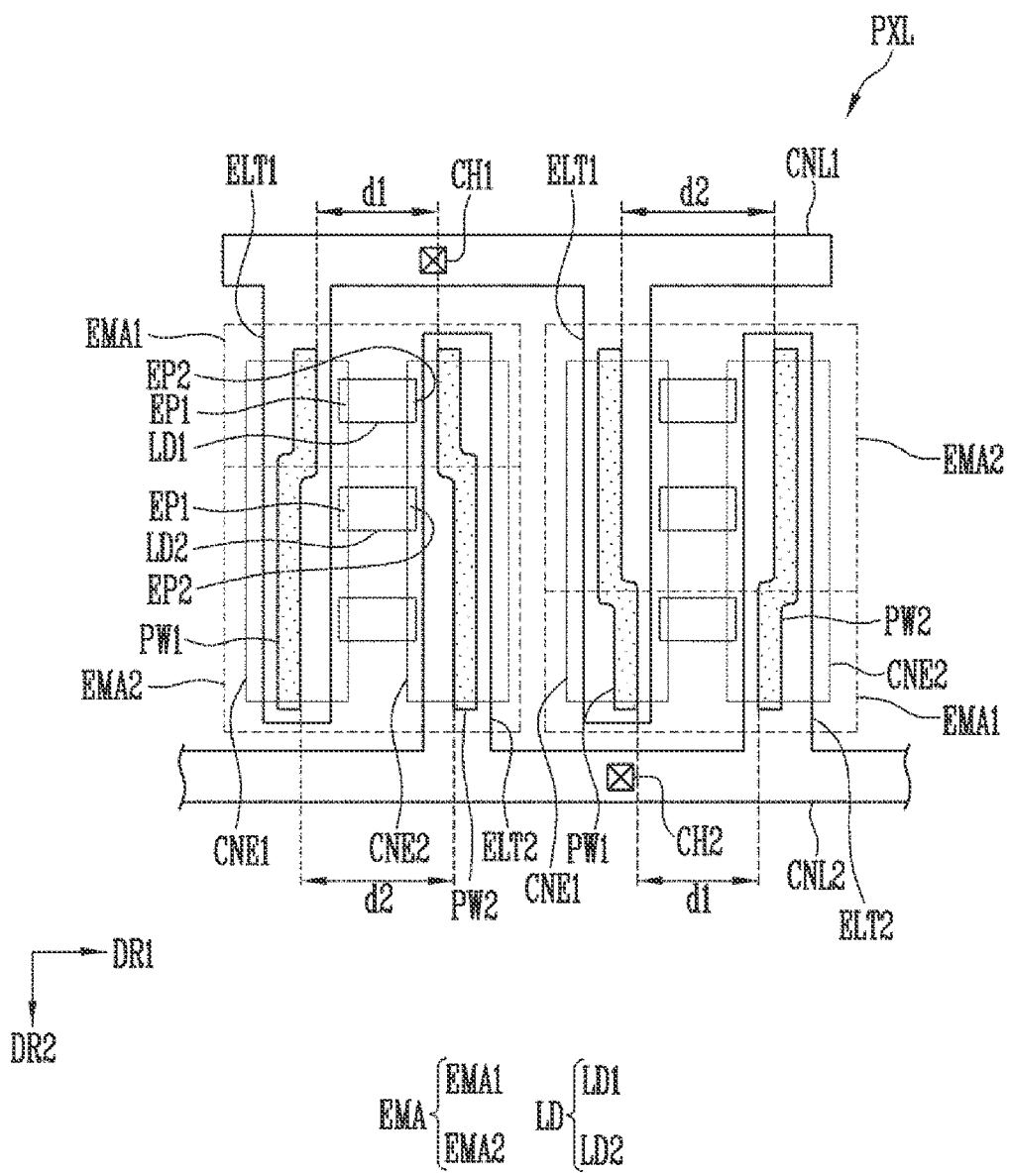

For example, as illustrated in FIG. 14, the emission area EMA may be divided into first and second emission areas EMA1 and EMA2 along the first direction DR1 and the second direction DR2. In an embodiment, the first and second emission areas EMA1 and EMA2 may be alternately disposed, but the present disclosure is not limited thereto.

Figure 15:
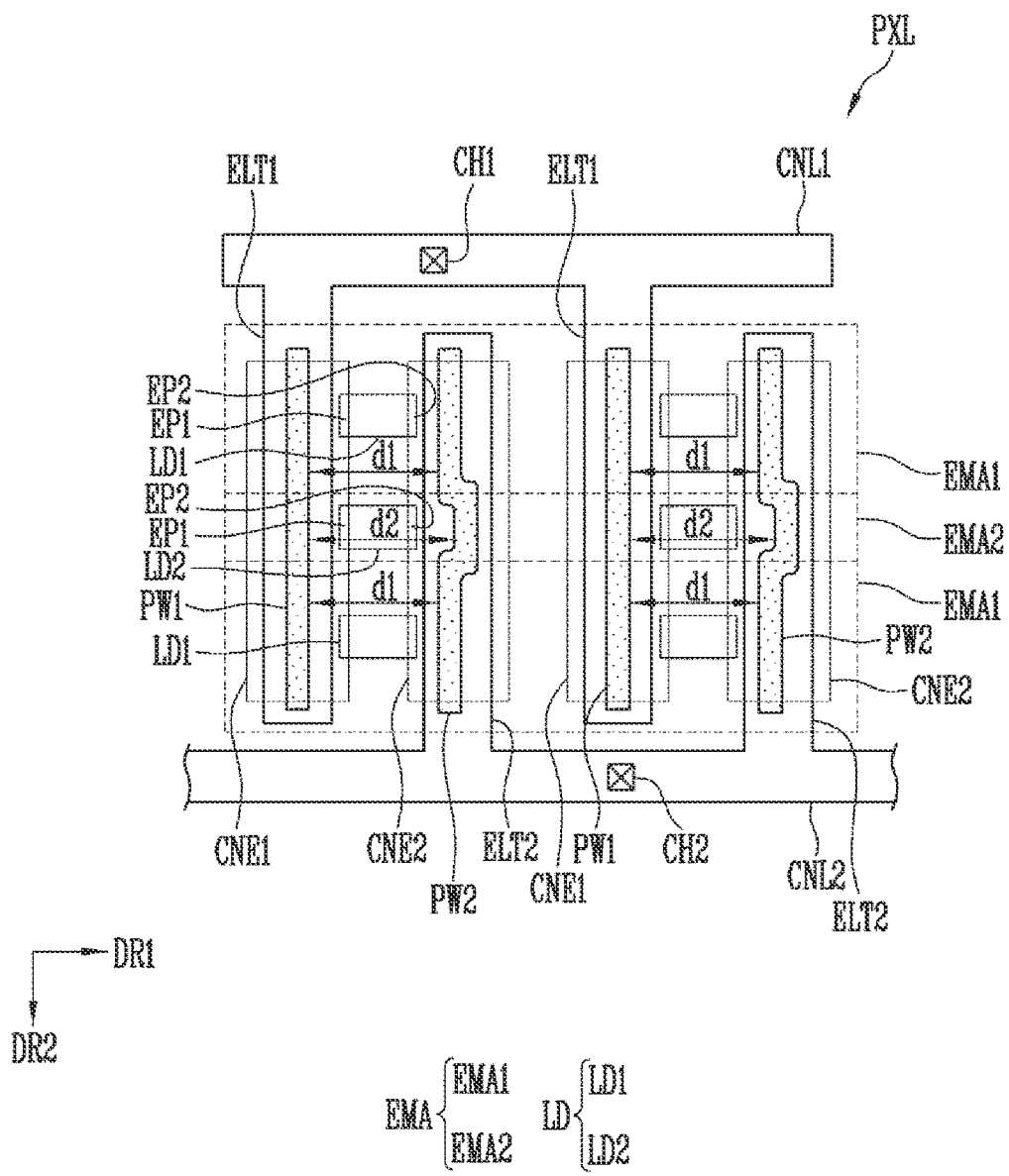
Figure 16:
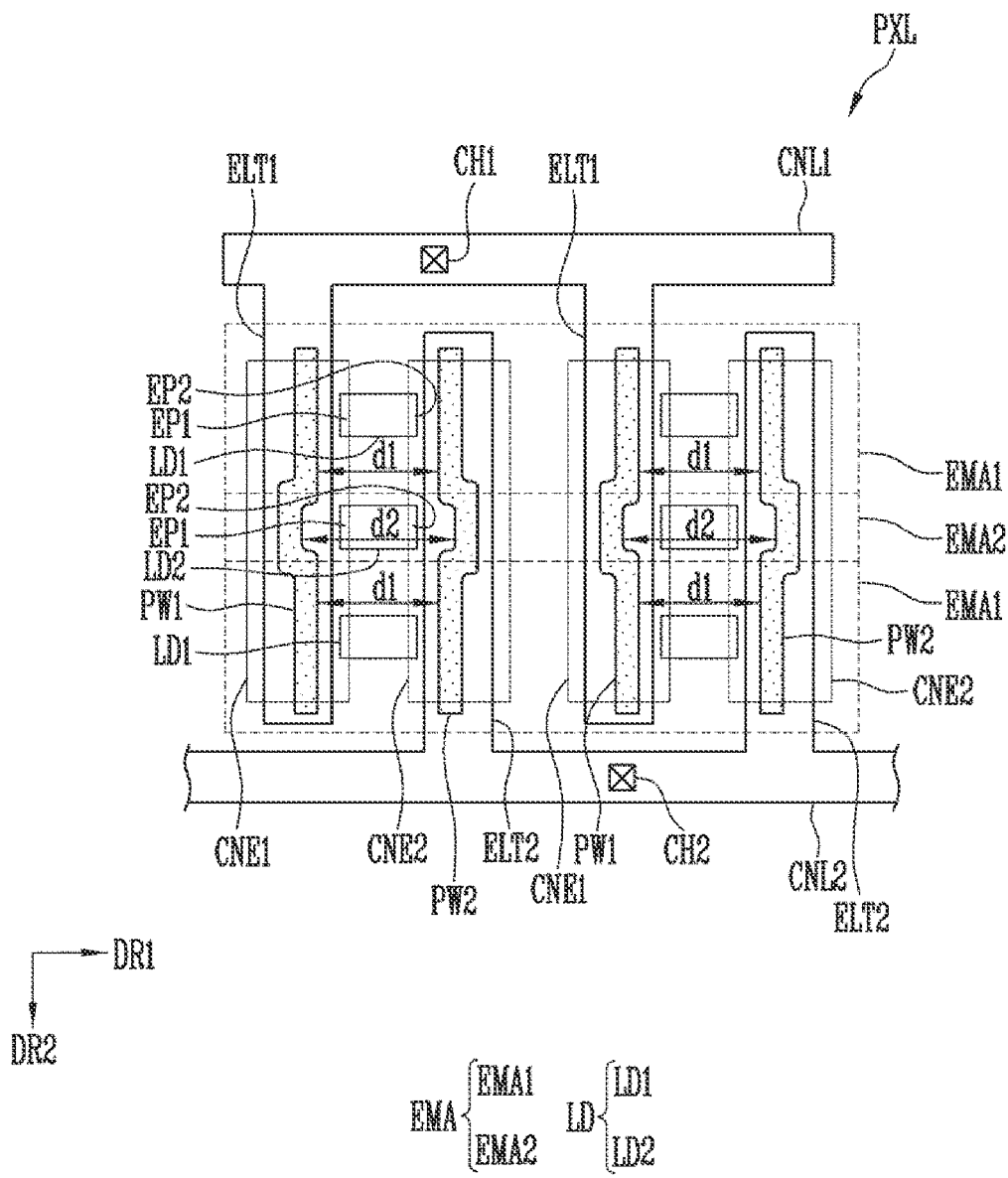

In an embodiment, the emission area EMA of each pixel PXL may be divided into three or more sections or areas along any one direction. For example, as illustrated in FIGS. 15 and 16, the emission area EMA may be divided along the second direction DR2 into three or more sections or areas including a plurality of first emission areas EMA1 and at least one second emission area EMA2 interposed therebetween. Here, the first and second emission areas EMA1 and EMA2 may be defined based on the distance between a pair of first and second partition walls PW1 and PW2 corresponding to each other. For example, in two first emission areas EMA1, each pair of first and second partition walls PW1 and PW2 may be disposed at positions spaced apart from each other by an identical first distance d1. However, the present disclosure is not limited thereto, and in the emission area EMA of each pixel PXL, the distance between the first and second partition walls PW1 and PW2 may vary to have at least three values.

For example, in an embodiment, in the two first emission areas EMA1 illustrated in FIGS. 15 and 16, the distances between a pair of first and second partition walls PW1 and PW2 may be set to different values. In this case, the emission area EMA of each pixel PXL may not only include one first emission area EMA1 and one second emission area EMA2 but may also include a third emission area (not shown) in which a pair of first and second partition walls PW1 and PW2 are disposed at positions spaced apart from each other by a distance different from that in the first and second emission areas EMA1 and EMA2. In other words, in an embodiment, in the emission area EMA of each pixel PXL, the distance between a pair of first and second partition walls PW1 and PW2 may have three or more different values.

Figure 17:
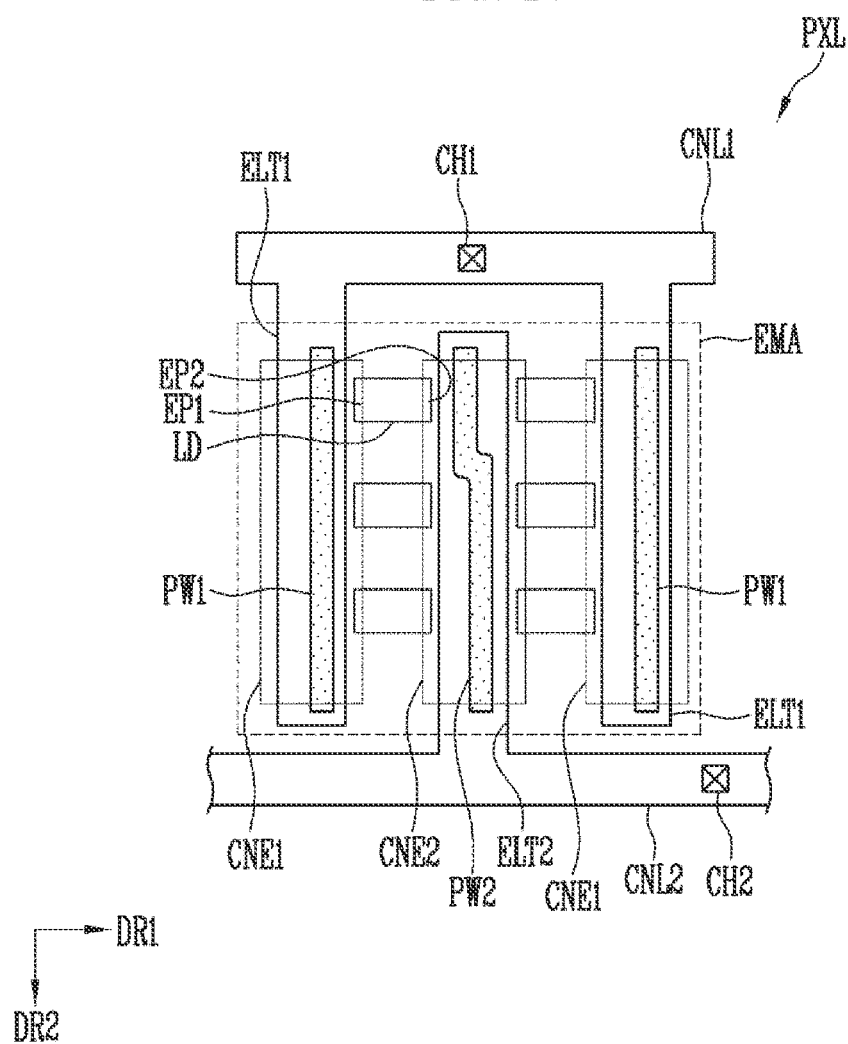
FIGS. 17 to 19 each are a plan view illustrating different examples of a pixel including a light emitting device in accordance with one or more embodiments of the present disclosure.
Figure 18:
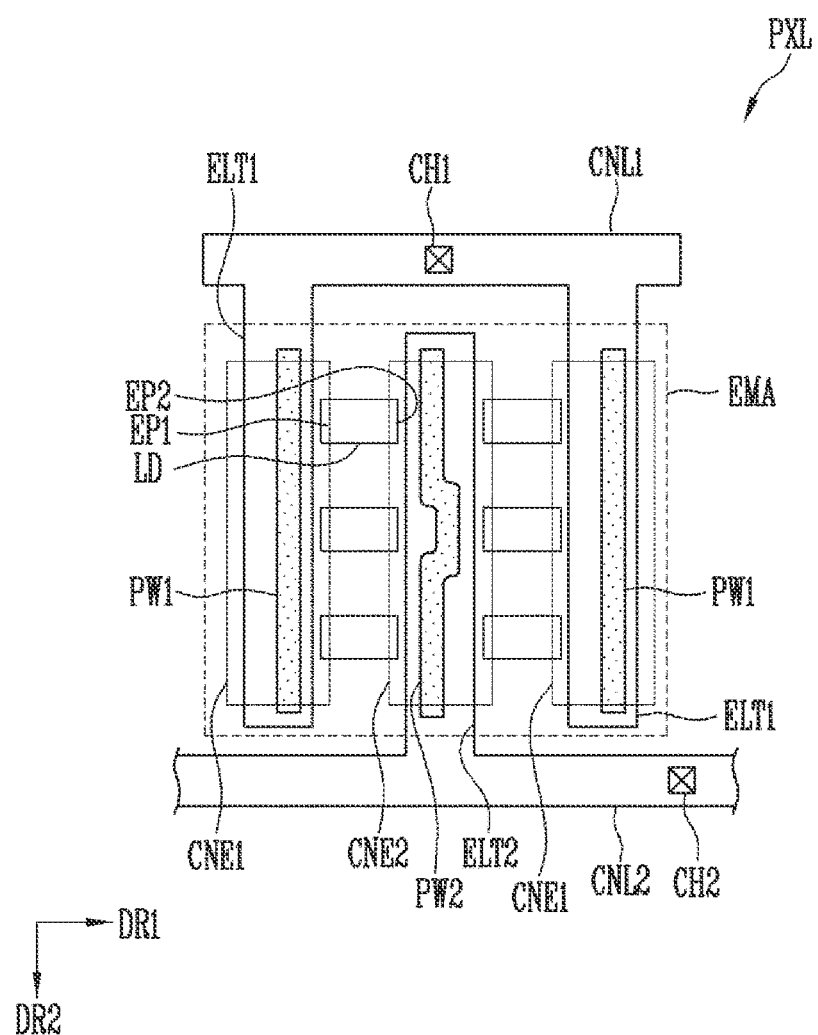
Figure 19:
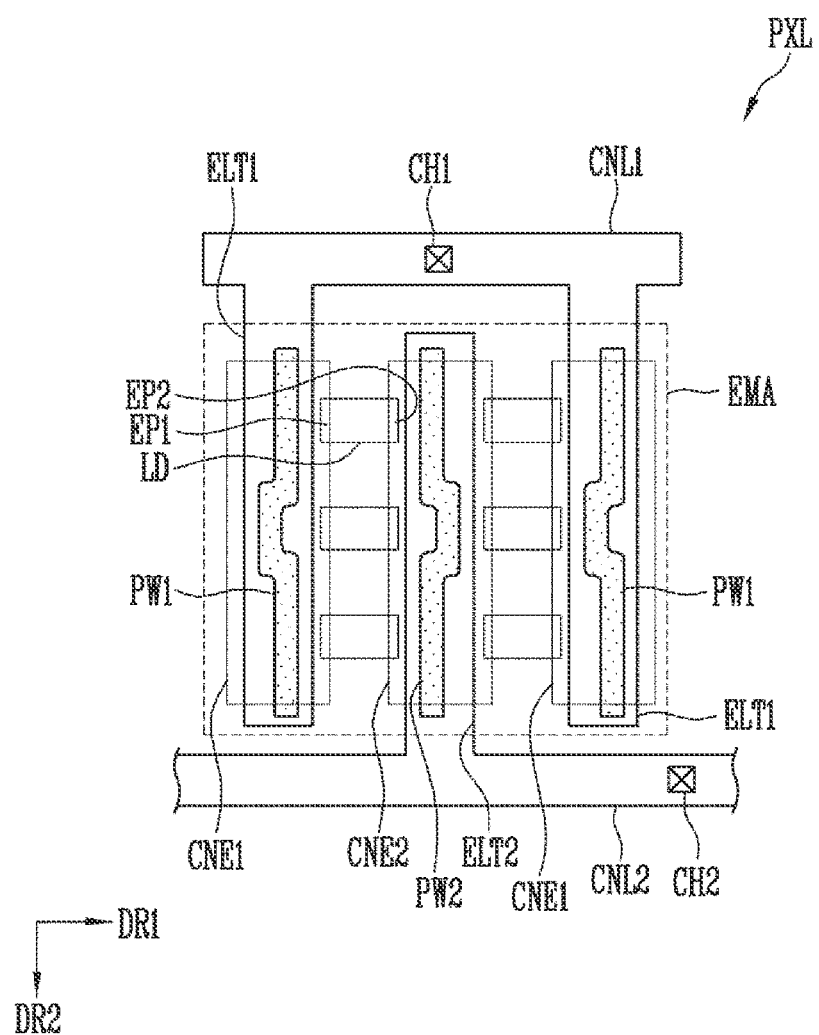

FIGS. 17 to 19 each are a plan view illustrating different examples of a pixel PXL including a light emitting device in accordance with one or more embodiments of the present disclosure. In the description of the embodiment of FIGS. 17 to 19, like reference numerals will be used to designate components similar or equal to those of the previous embodiments, and duplicative explanations thereof will not be provided.

Referring to FIGS. 17 to 19, the numbers of first electrodes ELT1 and second electrodes ELT2 disposed in the emission area EMA of each pixel PXL may differ from each other. Furthermore, consequently, the numbers of first partition walls PW1 and second partition walls PW2 disposed in the emission area EMA may also differ from each other.

For example, in each emission area EMA, a plurality of first electrodes ELT1, a plurality of first partition walls PW1, a single second electrode ELT2, and a single second partition wall PW2 may be disposed. In this case, the plurality of first electrodes ELT1 may make a pair while sharing the single second electrode ELT2. The plurality of first partition walls PW1 may make a pair while sharing the single second partition wall PW2.

In the foregoing embodiments, at least one of the first and second partition walls PW1 and PW2 may also have at least one bent part. Thus, the distance between the pair of first and second partition walls PW1 and PW2 may vary for respective partition areas or sections in the emission area EMA. In other words, in the embodiments of FIGS. 17 to 19, each emission area EMA may be divided into a plurality of areas, e.g., including the first and second emission areas EMA1 and EMA2 as described in the preceding embodiments, by adjusting the shape of each of the first and second partition walls PW1 and PW2 and/or the distance between the first and second partition walls PW1 and PW2. A scheme of partitioning each emission area EMA may be changed in various suitable ways.

Figure 20:
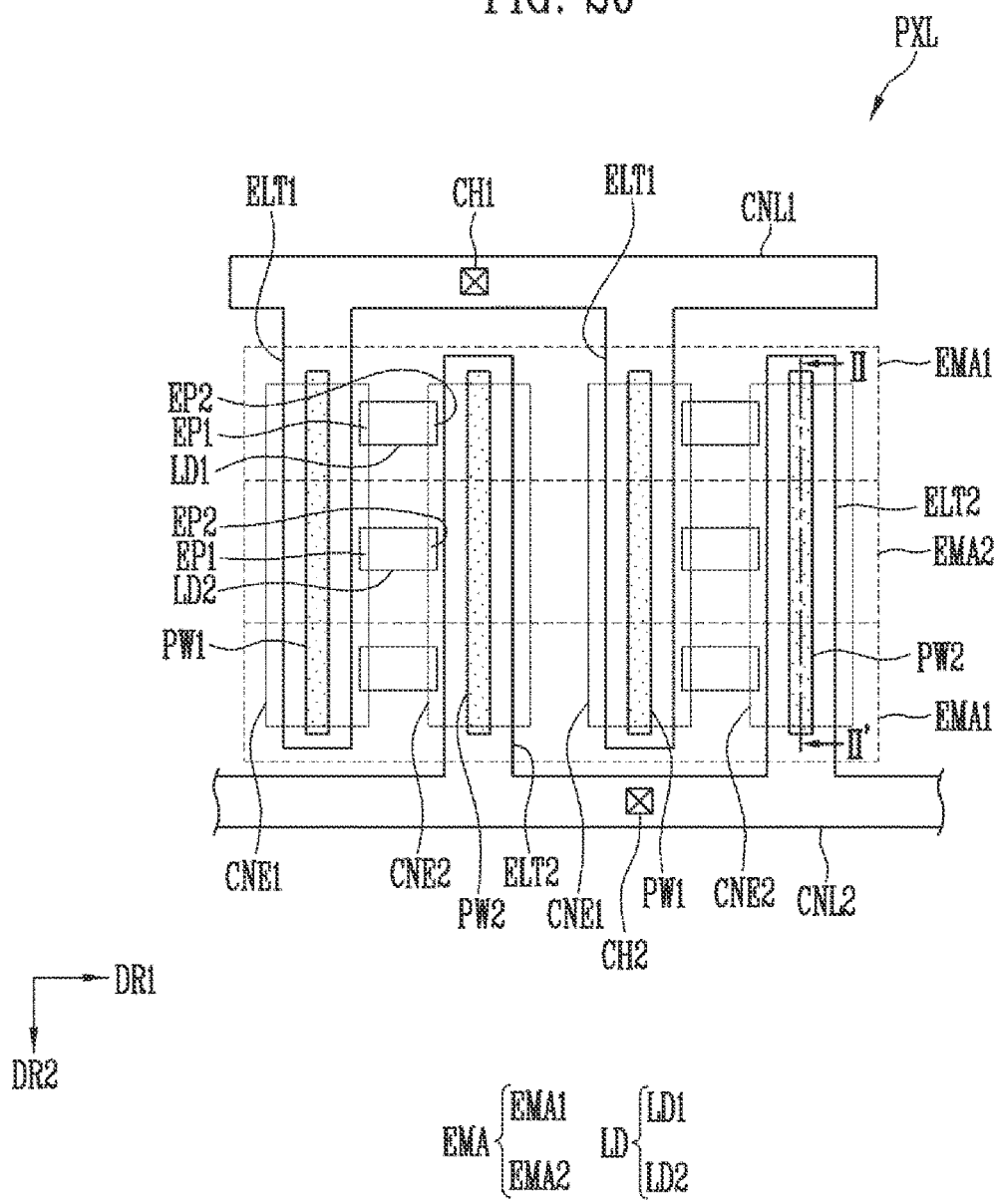
FIG. 20 is a plan view illustrating an example of a pixel including a light emitting device in accordance with an embodiment of the present disclosure.
Figure 21:
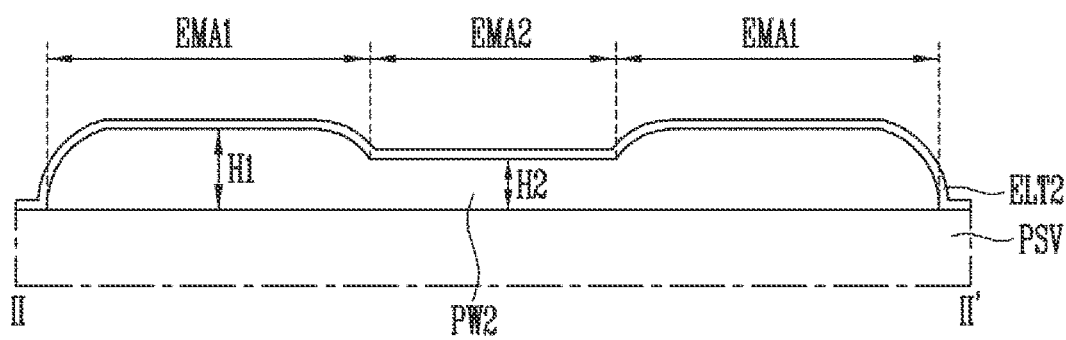
FIG. 21 is a sectional view illustrating a structure of a partition wall corresponding to line II-II' of FIG. 20.
Figure 22:
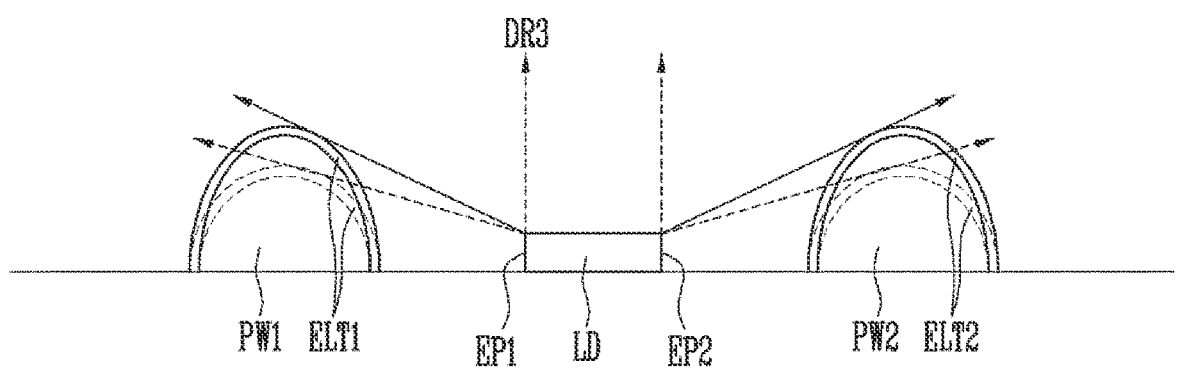
FIG. 22 is a sectional view illustrating a change in view angle depending on the height of each of the first and second partition walls in accordance with an embodiment of the present disclosure.

FIG. 20 is a plan view illustrating an example of a pixel PXL including a light emitting device in accordance with an embodiment of the present disclosure. FIG. 21 is a sectional view illustrating a structure of a partition wall (e.g., the second partition wall PW2) corresponding to line II-II' of FIG. 20. To clarify the structure of the partition wall in accordance with an embodiment. FIG. 21 schematically shows only a sectional view of the second partition wall PW2 and the second electrode ELT2 taken along line II-II' of FIG. 20, and illustration of other peripheral components will be omitted FIG. 22 is a sectional view illustrating a change in view angle depending on the height of each of the first and second partition walls PW1 and PW2. In the description of the embodiment of FIGS. 20 to 22, like reference numerals will be used to designate components similar or equal to those of the previous embodiments, and duplicative explanations thereof will not be provided.

Referring to FIGS. 20 and 21, the second partition wall PW2 may vary in height between the first emission area EMA1 and the second emission area EMA2. For example, each second partition wall PW2 may have a first height H1 in the first emission area EMA1, and may have a second height H2 less than the first height H1 in the second emission area EMA2 adjacent to the first emission area EMA1. The second electrode ELT2 may have a shape corresponding to the second partition wall PW2. For example, the second electrode ELT2 may have a concave part corresponding to the second emission area EMA2.

Although FIG. 21 illustrates only the sectional view of the second partition wall PW2 and the second electrode ELT2 taken along line II-II' of FIG. 20, in some embodiments, the first partition wall PW1 and the first electrode ELT1 may also have substantially the same cross-sectional structure as that of the second partition wall PW2 and the second electrode ELT2. For example, each first partition wall PW1 may have a first height H1 in the first emission area EMA1, and may have a second height H2 less than the first height H1 in the second emission area EMA2. The first electrode ELT1 may have a shape corresponding to the first partition wall PW1. For example, the first electrode ELT1 may have a concave part corresponding to the second emission area EMA2.

The present disclosure is not always limited to an embodiment in which the first and second partition walls PW1 and PW2 have the same shape and/or height. In other words, the first and second partition walls PW1 and PW2 may have substantially the same shape and/or height, or may have different shapes and/or heights. In an embodiment of the present disclosure, at least one of the first and second partition walls PW1 and PW2 may have a different height for each emission area EMA.

Although FIGS. 20 and 21 illustrate the embodiment in which each of the first and second partition walls PW1 and PW2 has two kinds of heights including the first height Hi and the second height H2 for each emission area EMA, the present disclosure is not limited thereto. For example, the first and/or second partition walls PW1 and PW2 may have three or more kinds of heights for each section or area in the emission area EMA of each pixel PXL.

Referring to FIG. 22, depending on the heights of the first and second partition walls PW1 and PW2, the propagation path of light emitted from each light emitting diode LD, particularly, each of the first and second ends EP1 and EP2 of the light emitting diode LD, may be changed. For example, as the heights of the first and second partition walls PW1 and PW2 are increased, the view angle range within which light emitted from the first and second ends EP1 and EP2 propagates is reduced with respect to the frontal direction (e.g., the third direction DR3) of the display panel PNL.

As described in the foregoing embodiment, if the emission area EMA of each pixel PXL is divided into a plurality of emission areas, e.g., the first and second emission areas EMA1 and EMA2, and the first and second partition walls PW1 and PW2 have different heights for each emission area EMA, the profile of light emitted from the first emission area EMA1 and the profile of light emitted from the second emission area EMA2 may have different aspects. Therefore, light emitted from each light emitting device and the pixel PXL including the light emitting device may be dispersed and emitted within a relatively wide view angle range. Furthermore, the profile of light emitted from each emission area EMA may be controlled to correspond to a desired view angle range by adjusting the height of the first and/or second partition wall PW1 and/or PW2.

Figure 23:
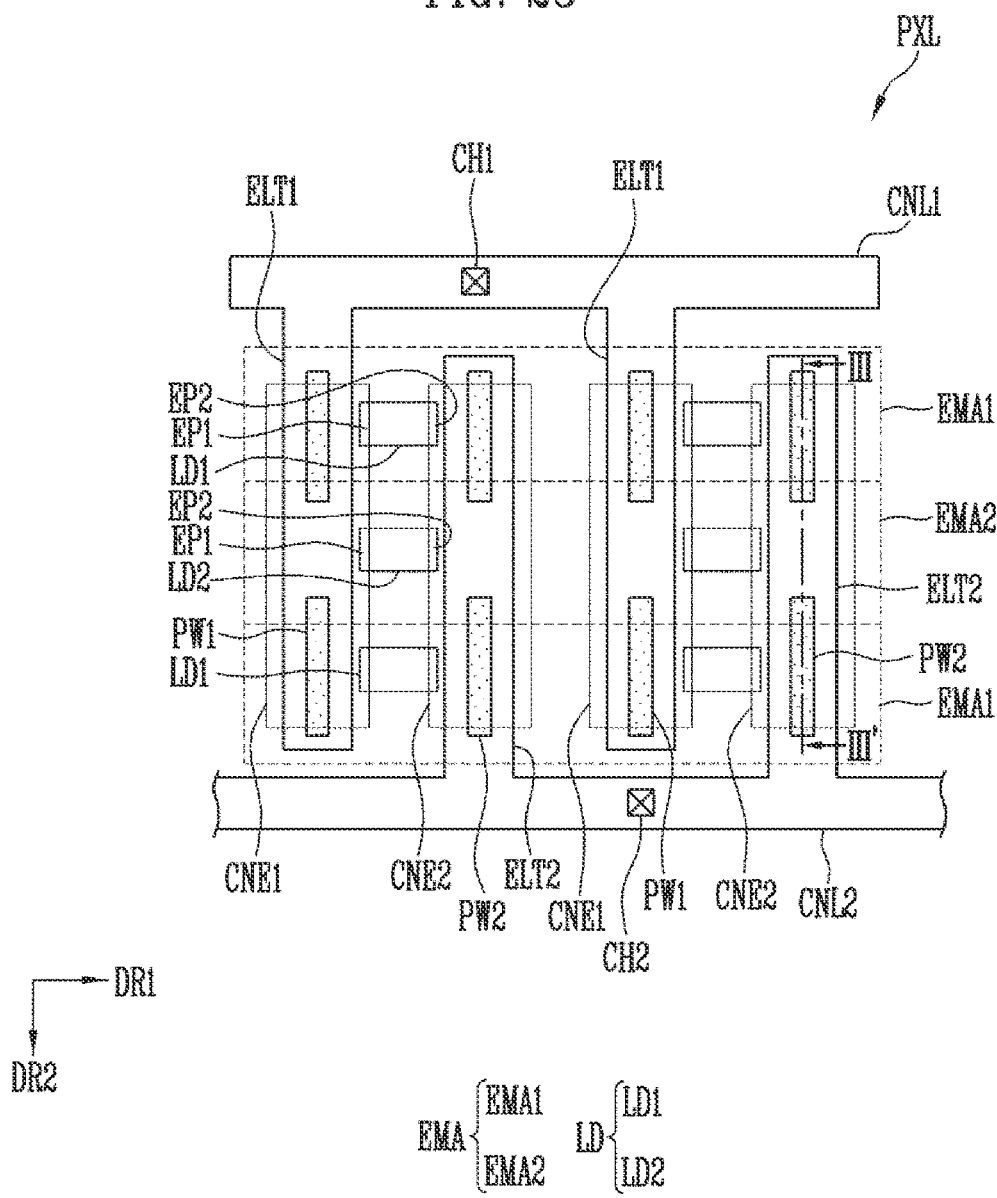
FIG. 23 is a plan view illustrating an example of a pixel including a light emitting device in accordance with an embodiment of the present disclosure.
Figure 24:
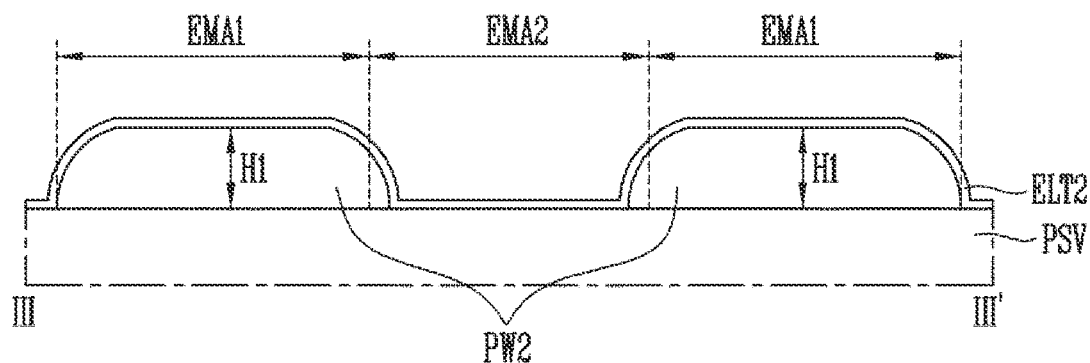
FIG. 24 is a sectional view illustrating a structure of a partition wall corresponding to line III-III' of FIG. 23.
Figure 25:
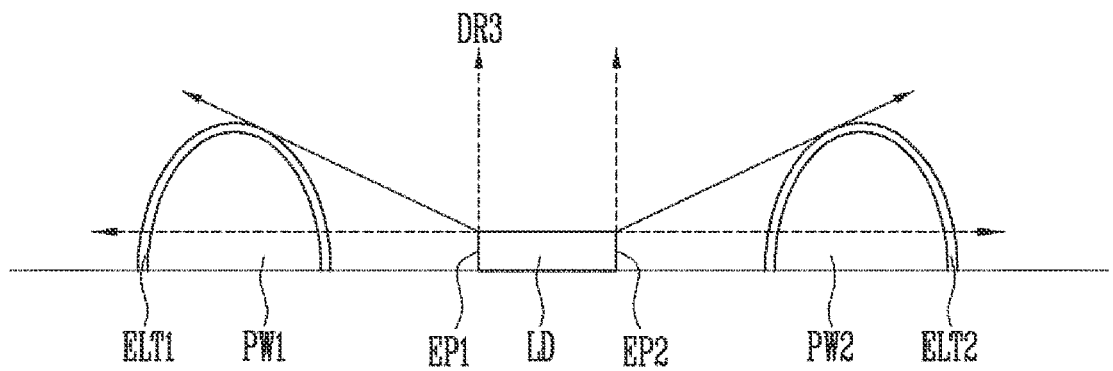
FIG. 25 is a sectional view illustrating a change in view angle depending on whether the first and second partition walls are present in accordance with an embodiment of the present disclosure.

FIG. 23 is a plan view illustrating an example of a pixel PXL including a light emitting device in accordance with an embodiment of the present disclosure. FIG. 24 is a sectional view illustrating a structure of a partition wall (e.g., the second partition wall PW2) corresponding to line III-III' of FIG. 23. To clarify the structure of the partition wall in accordance with an embodiment, FIG. 24 schematically shows only a sectional view of the second partition wall PW2 and the second electrode ELT2 taken along line III-III' of FIG. 23. FIG. 25 is a sectional view illustrating a change in view angle depending on whether the first and second partition walls PW1 and PW2 are present. In an embodiment of FIGS. 23 to 25, like reference numerals are used to designate identical or similar components as those of the embodiments of FIGS. 20 to 22, and duplicative descriptions thereof will not be provided.

Referring to FIGS. 23 and 24, the first and second partition walls PW1 and PW2 may have discontinuous patterns in the emission area EMA of each pixel PXL. For example, in the first emission areas EMA1, the first and second partition walls PW1 and PW2 may have patterns that continuously extend in a predetermined (or set) direction, e.g., in the second direction DR2, and may be disposed to face the first and second ends EP1 and EP2 of the corresponding first light emitting diode LD1. The first and second partition walls PW1 and PW2 may have discontinuous patterns in the second emission area EMA2 and thus may expose the first and second ends EP1 and EP2 of at least one corresponding second light emitting diode LD2.

Although, in the embodiment of FIGS. 23 and 24, all of the first and second partition walls PW1 and PW2 have discontinuous patterns, the present disclosure is not limited thereto. For example, in an embodiment, only some of the first and second partition walls PW1 and PW2 may have discontinuous patterns.

Although, in the embodiment of FIGS. 23 and 24, the first and second partition walls PW1 and PW2 have patterns that are discontinuous in the same section, e.g., in the same second emission area EMA2, the present disclosure is not limited thereto. For example, in an embodiment, the first partition wall PW1 and the second partition wall PW2 that faces the first partition wall PW1 may be removed (may be absent) in different sections or areas to form discontinuous patterns.

Referring to FIG. 25, with regard to each light emitting diode LD, the propagation path of light emitted from the light emitting diode LD may be controlled by selectively removing the first and second partition walls PW1 and PW2 that face the first and second ends EP1 and EP2 of the light emitting diode LD. For example, in the case where the first and second partition walls PW1 and PW2 are disposed to face the first and second ends EP1 and EP2 of the light emitting diode LD, the view angle may be limited with respect to the lateral direction. On the other hand, in the case where portions of the first and second partition walls PW1 and PW2 that are around the first and second ends EP1 and EP2 of the light emitting diode LD are removed, the view angle of light emitted from the light emitting diode LD may expand to a range of approximately 90°.

Figure 26:
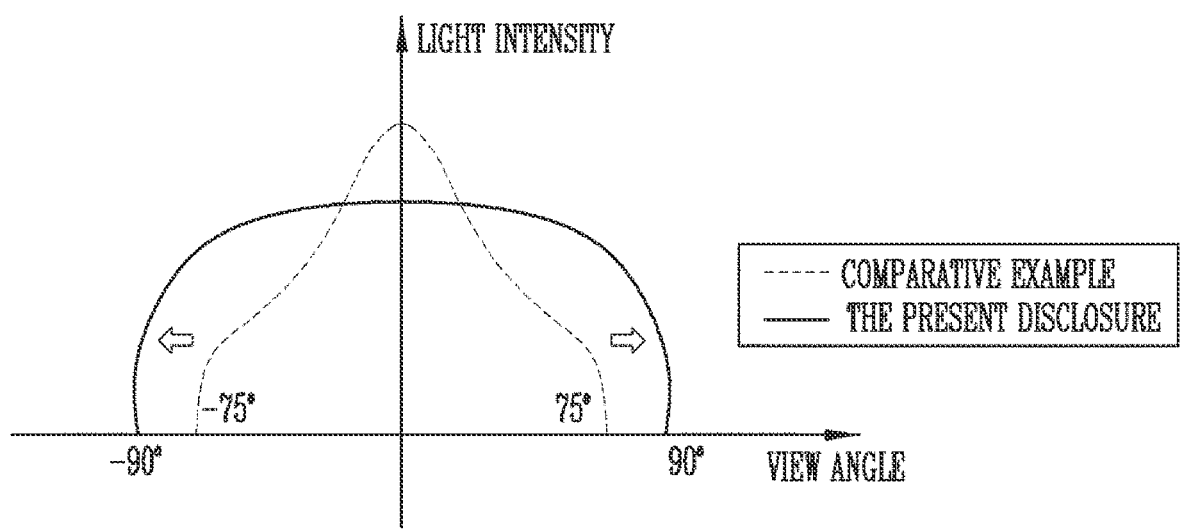
FIG. 26 illustrates a profile of light emitted from a light emitting device in accordance with an embodiment of the present disclosure and a profile of light emitted from a light emitting device according to a comparative example.

FIG. 26 illustrates a profile of light emitted from a light emitting device in accordance with an embodiment of the present disclosure and a profile of light emitted from a light emitting device according to a comparative example. For example, FIG. 26 schematically illustrates a result of comparing a profile of light emitted from the light emitting device according to at least one of the above-described embodiments with a profile of light emitted from the light emitting device according to the comparative example in which each of the first and second partition walls PW1 and PW2 has s uniform height and the distance therebetween is uniform.

The effects of the present disclosure will be described with reference to FIG. 26 along with the above-described embodiments. In embodiments of the present disclosure, the emission area EMA of each light emitting device or each pixel PXL including the light emitting device is divided into a plurality of emission areas (e.g., the first and second emission areas EMA1 and EMA2), and the structures of the first and second partition walls PW1 and PW2 are differentially configured or designed (have different configurations and/or designs) for each emission area EMA. Hence, the view angle range of the pixel PXL (or the light emitting device corresponding thereto) and the display device including the pixel PXL may expand.

Each of the above-described embodiments may be individually applied, or at least two embodiments may be complexly applied. For example, according to at least one of the above-described embodiments, at least one of the distance between the first and second partition walls PW1 and PW2 and the height and shape of each of the first and second partition walls PW1 and PW2 may be differentially applied (may be different) for each emission area EMA. Consequently, light emitted from the light emitting diodes LD (particularly, the first and second ends EP1 and EP2 of the light emitting d-odes LD) provided in each light emitting device or each pixel PXL may be dispersed and emitted within a comparatively wide view angle range (e.g., the maximum ±90°).

While the scope of the present disclosure are described by detailed example embodiments, it should be noted that the above-described embodiments are merely descriptive and should not be considered limiting. It should be understood by those skilled in the art that various changes, substitutions, and alternations may be made herein without departing from the scope of the disclosure as defined by the claims.

The scope of the present disclosure is not limited by detailed descriptions of the present specification, and should be defined by the claims. Furthermore, all changes or modifications of the present disclosure derived from the meanings and scope of the claims and equivalents thereof should be construed as being included in the scope of the present disclosure.

The invention claimed is:

1. A light emitting device comprising:
a first emission area comprising a first light emitting diode;
a second emission area comprising a second light emitting diode;
at least one pair of first and second partition walls in each of the first emission area and the second emission area, wherein the at least one pair of first and second partition walls are facing each other;
at least one first electrode on a first partition wall of the at least one pair of first and second partition walls to cover the first partition wall, wherein the at least one first electrode is electrically connected to a first end of at least one of the first and second light emitting diodes; and
at least one second electrode on a second partition wall of the at least one pair of first and second partition walls to cover the second partition wall, wherein the at least one second electrode is electrically connected to a second end of at least one of the first and second light emitting diodes,
wherein the at least one pair of first and second partition walls have, in the first emission area, a structure different from a structure thereof in the second emission area.

2. The light emitting device according to claim 1,
wherein the at least one pair of first and second partition walls are in the first emission area and are spaced apart from each other by a first distance, and
wherein the at least one pair of first and second partition walls are in the second emission area and are spaced apart from each other by a second distance greater than the first distance.

3. The light emitting device according to claim 2,
wherein the at least one pair of first and second partition walls are spaced apart from each other in a first direction in each of the first emission area and the second emission area, and
wherein each of the first partition wall and the second partition wall extends in a second direction intersecting with the first direction.

4. The light emitting device according to claim 3, wherein the first emission area and the second emission area are successively arranged in the first direction.

5. The light emitting device according to claim 3, wherein the first emission area and the second emission area are successively arranged in the second direction.

6. The light emitting device according to claim 5,
wherein each of the first partition wall and the second partition wall of the at least one pair of first and second partition walls integrally extends in the first emission area and the second emission area, and
wherein at least one of the first partition wall and the second partition wall has a bent part on a boundary between the first emission area and the second emission area.

7. The light emitting device according to claim 6, wherein the bent part has a curved shape on the boundary between the first emission area and the second emission area.

8. The light emitting device according to claim 1, wherein the first partition wall and the second partition wall of the at least one pair of first and second partition walls have a symmetrical structure in each of the first emission area and the second emission area.

9. The light emitting device according to claim 1, wherein the first partition wall and the second partition wall of the at least one pair of first and second partition walls have an asymmetrical structure in at least one of the first emission area and the second emission area.

10. The light emitting device according to claim 1, wherein at least one of the first partition wall and the second partition wall has a first height in the first emission area and a second height, less than the first height, in the second emission area.

11. The light emitting device according to claim 1,
wherein in the first emission area, each of the first partition wall and the second partition wall has a pattern continuously extending in a set direction, and
wherein in the second emission area, each of the first partition wall and the second partition wall has a discontinuous pattern.

12. The light emitting device according to claim 11,
wherein the at least one pair of first and second partition walls respectively face the first end and the second end of the first light emitting diode in the first emission area, and
wherein the at least one pair of first and second partition walls respectively expose the first end and the second end of the second light emitting diode in the second emission area.

13. The light emitting device according to claim 1, wherein the at least one pair of first and second partition walls comprises:
an 11-th partition wall in the first emission area;

a 21-st partition wall in the first emission area and forming a pair of first and second partition walls with the 11-th partition wall;

a 12-th partition wall in the second emission area; and a 22-nd partition wall in the second emission area and forming an another pair of first and second partition walls with the 12-th partition wall.

14. The light emitting device according to claim 13, wherein the at least one first electrode comprises:
    an 11-th electrode on the 11-th partition wall; and
    a 12-th electrode on the 12-th partition wall and connected to the 11-th electrode.

15. The light emitting device according to claim 13, wherein the at least one first electrode comprises:
    an 11-th electrode on the 11-th partition wall; and
    a 12-th electrode on the 12-th partition wall and separated from the 11-th electrode.

16. The light emitting device according to claim 1, wherein the at least one pair of first and second partition walls comprises:
    an 11-th partition wall in the first emission area;
    a 12-th partition wall in the second emission area; and
    a second common partition wall in an intersection area between the first emission area and the second emission area, the second common partition wall forming a pair of first and second partition walls with each of the 11-th partition wall and the 12-th partition wall.

17. The light emitting device according to claim 1,
    wherein each of the at least one first electrode and the at least one second electrode comprises at least one reflective electrode layer, and
    wherein the first end of the at least one of the first and second light emitting diodes faces the at least one first electrode, and the second end of the at least one of the first and second light emitting diodes faces the at least one second electrode.

18. A display device comprising:
    a display area; and
    a pixel in the display area,
    wherein the pixel comprises:
      a first emission area comprising a first light emitting diode;
      a second emission area comprising a second light emitting diode;
      at least one pair of first and second partition walls in each of the first emission area and the second emission area, wherein the at least one pair of first and second partition walls are facing each other;
      at least one first electrode on a first partition wall of the at least one pair of first and second partition walls to cover the first partition wall, wherein the at least one first electrode is electrically connected to a first end of at least one of the first and second light emitting diodes; and
      at least one second electrode on a second partition wall of the at least one pair of first and second partition walls to cover the second partition wall, wherein the at least one second electrode is electrically connected to a second end of at least one of the first and second light emitting diodes,
    wherein the at least one pair of first and second partition walls have, in the first emission area, a structure different from a structure thereof in the second emission area.

19. The display device according to claim 18, wherein a height of each of the first partition wall and the second partition wall of the at least one pair of first and second partition walls or a distance between the first and second partition walls of the at least one pair of first and second partition walls in the first emission area differs from a height thereof or a distance therebetween in the second emission area.

20. The display device according to claim 18,
    wherein, in the first emission area, the first partition wall and the second partition wall of the at least one pair of first and second partition walls each independently have a pattern continuously extending in a set direction, and respectively face the first end and the second end of the first light emitting diode, and
    wherein, in the second emission area, the first partition wall and the second partition wall of the at least one pair of first and second partition walls each independently have a discontinuous pattern and expose the first and second ends of the second light emitting diode.

* * * * *